United States Patent [19]
Sanjoh

[11] Patent Number: 6,110,273
[45] Date of Patent: Aug. 29, 2000

[54] CRYSTAL GROWTH METHOD AND SOLID-STATE COMPONENT AND APPARATUS FOR CRYSTAL GROWTH EMPLOYED THEREFOR

[75] Inventor: Akira Sanjoh, Osaka, Japan

[73] Assignee: Sumitomo Metal Industries, Ltd., Osaka, Japan

[21] Appl. No.: 09/219,534

[22] Filed: Dec. 23, 1998

Related U.S. Application Data

[63] Continuation of application No. PCT/JP97/02169, Jun. 23, 1997.

[30] Foreign Application Priority Data

| Jun. 26, 1996 | [JP] | Japan | 8-186594 |
| Jun. 26, 1996 | [JP] | Japan | 8-186600 |
| Jun. 26, 1996 | [JP] | Japan | 8-186608 |

[51] Int. Cl.$^7$ .............................. C30B 7/12; C30B 29/58
[52] U.S. Cl. ............................................. 117/68; 117/927
[58] Field of Search .............................. 117/11, 68, 206, 117/927, 5; 204/165; 422/245.1

[56] References Cited

U.S. PATENT DOCUMENTS

| 4,990,216 | 2/1991 | Fujita et al. . |
| 5,087,952 | 2/1992 | Ribi ........................................... 357/25 |
| 5,525,198 | 6/1996 | Craig et al. ............................... 204/165 |
| 5,597,457 | 1/1997 | Craig et al. ............................... 204/165 |

FOREIGN PATENT DOCUMENTS

| 274824A1 | 7/1988 | European Pat. Off. . |
| 402917A2 | 12/1990 | European Pat. Off. . |
| 2-18373 | 1/1990 | Japan . |
| 08034699 | 2/1996 | Japan . |
| 8-34699A | 2/1996 | Japan . |

OTHER PUBLICATIONS

Wolf, S., et al., Silicon Processing for VLSI Era vol. 1—Process Technology, Lattice Press, Sunst Beach, Calif., USA, pp. 321–323, 529–532, 539–542, 1986.

"A Method for the Preparation of Thin Single Crystal Films of Organic Superconductors", Journal of Crystal Growth 106 (1990) Dec., No. 4, M. Thakur et al.

Artificial Epitaxy (Graphoepitaxy) of Proteins), Journal of Crystal Growth 112 (1991) Jul, No. 4, E.I. Givargizov et al.

*Primary Examiner*—Benjamin L. Utech
*Assistant Examiner*—Matthew Anderson
*Attorney, Agent, or Firm*—Burns, Doane, Swecker & Mathis, LLP

[57] ABSTRACT

Provided is a method which can facilitate crystallization of a biological macromolecule such as protein. A silicon crystal whose valence electrons are controlled so that the concentration of holes or electrons in the surface part can be controlled in response to the environment of a buffer solution containing a biological macromolecule such as protein is brought into contact with the solution, for depositing a crystal of the biological macromolecule on the surface of the silicon crystal. A plurality of grooves or holes whose sizes differ from each other are formed on the silicon crystal, and the valence electrons are so controlled that crystallization of the biological macromolecule is facilitated inside rather than outside the grooves or holes. The crystal of the biological macromolecule grows in the grooves or holes coming into contact with the solution.

18 Claims, 24 Drawing Sheets

FIG. 22A
FIG. 22B
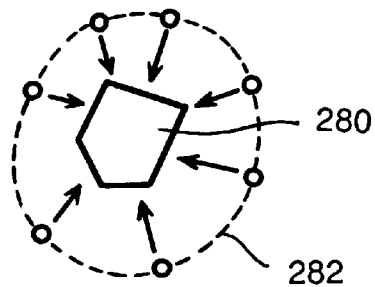
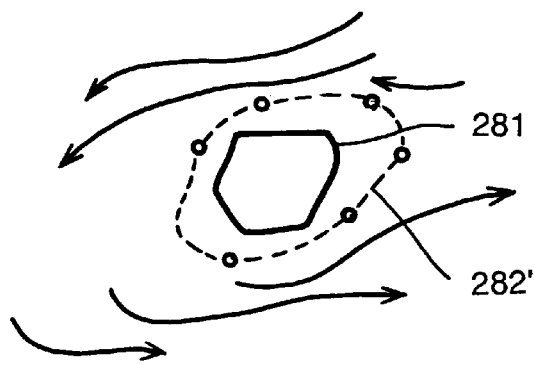
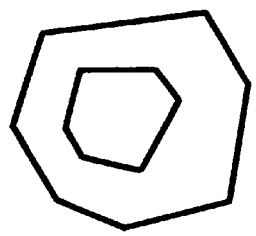
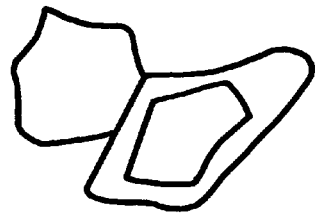
FIG. 23
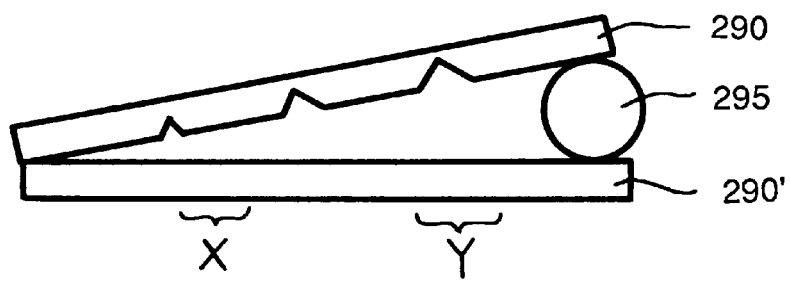

0.1mm 0.1mm 0.1mm 0.1mm 0.1mm 0.1mm 0.1mm 0.1mm 0.1mm

CRYSTAL GROWTH METHOD AND SOLID-STATE COMPONENT AND APPARATUS FOR CRYSTAL GROWTH EMPLOYED THEREFOR

This is a continuation of International Application PCT/JP97/02169, with an international filing date of Jun. 23, 1997.

BACKGROUND OF THE INVENTION

1. Field of the Invention

The present invention relates to a method for performing crystallization of macromolecules and a solid-state component and an apparatus employed therefor, and more particularly, it relates to a technique for carrying out crystallization of various biological macromolecules such as protein by employing a semiconductor substrate or the like whose valence electrons are controlled.

2. Description of Background Art

For understanding specific properties and functions in various types of biological macromolecules such as protein and complexes thereof, detailed steric structures thereof are indispensable information. From the basic chemical viewpoint, for example, information on the three-dimensional structure of protein or the like serves as the basis for understanding the mechanism of function appearance in a biochemical system by an enzyme or hormone. Particularly in the fields of pharmaceutical science, genetic engineering and chemical engineering among industrial circles, the three-dimensional structure provides information indispensable for rational molecular design for facilitating drug design, protein engineering, biochemical synthesis and the like.

As a method of obtaining three-dimensional steric structural information of biological macromolecules at atomic levels, X-ray crystal structural analysis is the most cogent and high-accuracy means at present. Analytic speeds are remarkably improving by rapid improvement of arithmetic processing speeds of computers in addition to reduction of measuring times and improvement of measuring accuracy due to recent hardware improvement of X-ray light sources and analyzers. The three-dimensional structures are conceivably going to be clarified with the main stream of this method also from now on.

In order to decide the three-dimensional structure of a biological macromolecule by X-ray crystal structural analysis, on the other hand, it is indispensable to crystallize the target substance after extraction and purification. At present, however, there is neither technique nor apparatus which can necessarily crystallize any substance when applied, and hence crystallization is progressed while repeating trial and error drawing on intuition and experience under the present circumstances. A search by an enormous number of experimental conditions is necessary for obtaining a crystal of a biological macromolecule, and crystal growth forms the main bottleneck in the field of the X-ray crystallographic analysis.

Crystallization of a biological macromolecule such as protein is basically adapted to perform a treatment of eliminating a solvent from an aqueous or anhydrous solution containing the macromolecule thereby attaining a supersaturated state and growing a crystal, similarly to the case of a general low molecular weight compound such as inorganic salt. As typical methods therefor, there are (1) a batch method, (2) dialysis and (3) a gas-liquid correlation diffusion method, which are chosen in response to the type, the quantity, the properties etc. of a sample.

The batch method is a method of directly adding a precipitant eliminating hydration water to a solution containing a biological macromolecule for reducing the solubility of the biological macromolecule and converting the same to a solid phase. In this method, solid ammonium sulfate, for example, is frequently used. This method has such disadvantages that the same requires a large amount of solution sample, fine adjustment of a salt concentration and pH is difficult, skill is required for the operation, and reproducibility is low. As shown in FIG. 36, for example, the dialysis, which overcomes the disadvantages of the batch method, is a method of placing a solution 362 containing a biological macromolecule in the inside of a sealed dialytic tube 361 for continuously changing the pH etc. of a dialytic tube outer liquid 363 (e.g., a buffer solution) and making crystallization. According to this method, the salt concentrations of the inner and outer liquids and the pH difference are adjustable at arbitrary speeds, and hence the conditions for crystallization are easy to find out. As shown in FIG. 37, for example, the gas-liquid correlation diffusion method is a technique of placing a droplet 372 of a sample solution on a sample holder 371 such as a cover glass and placing this droplet and a precipitant solution 374 in a closed container 373, thereby slowly setting up equilibrium by evaporation of volatile components therebetween.

However, there are various problems in crystallization of a biological macromolecule such as protein as described above, in the present circumstances.

First, it has been difficult to obtain a crystal of excellent crystallinity or a large-sized single crystal. It is considered that this is because a biological macromolecule is readily influenced by gravity since its molecular weight is generally large and causes convection in a solution (e.g., F. Rosenberger, J. Cryst. Growth, 76, 618 (1986)). Namely, the biological macromolecule or a formed fine crystal nucleus precipitates by its own weight, whereby convection of the solution around the molecules or the nucleus is caused. Also around the formed crystal surface, the concentration of the molecules is decreased and local convection of the solution takes place. Due to the convection in the solution generated in the aforementioned manner, the formed crystal moves in the solution, and moreover the layer for supplying the molecules by diffusion in the periphery of the crystal is remarkably reduced. Thus, the crystal growth rate can be reduced, or anisotropic growth can take place on the crystal plane, so that crystallization can be hindered.

A large amount of solvent (mainly water) ($\geq 50$ volume %) is contained in a biological macromolecule crystal, dissimilarly to crystals of other substances. This solvent is disorderly and readily movable in the intermolecular clearances of the crystal. Although the molecules are gigantic, further, there is substantially no wide-ranging intermolecular packing contact in the crystal, and only slight molecule-to-molecule contact or contact by hydrogen bond through water molecules is present. Such a state is also the factor hindering crystallization.

Further, a biological macromolecule is extremely sensitive to the conditions employed for crystallization. While the biological macromolecule is stabilized in the solvent by interaction between individual molecular surfaces, charge distributions on the molecular surfaces, particularly conformation of amino acids in the vicinity of the molecular surfaces etc., extremely vary with the environment, i.e., pH, ionic strength and temperature of the solution, and type and dielectric constant of the buffer solution, and the like. Therefore, the crystallization process becomes a multi-parameter process in which complicated various conditions are entangled with each other, and it has been impossible to establish a unific technique which is applicable to any substance. As to protein, crystallization of hydrophobic membrane protein is extremely difficult at present although it is biochemically extremely important as compared with water-soluble protein, and very few examples of the hydrophobic membrane protein have succeeded in crystallization and analysis of high resolution.

Further, the obtained biological macromolecule is generally in a very small amount. For example, protein such as enzyme is generally extracted from cells or the like and purified, while the amount of the sample finally obtained for crystallization is generally extremely small since its content is small. It is said that the concentration of a biological macromolecule in a solution should be about 50 mg/ml for performing crystallization. Therefore, repeated crystallization experiments (screening) under various conditions should be carried out as to a solution of an amount as small as possible.

As described above, crystallization of biological macromolecules such as protein and complexes thereof forms the most significant bottleneck for the X-ray crystal structural analysis since the same has heretofore been progressed while repeating trial and error, although this is an important process in science and industry. Therefore, it is necessary to hereafter understand the basic principle of crystallization and develop a crystallization technique which is applicable to any molecule.

SUMMARY OF THE INVENTION

An object of the present invention is to technically overcome the disadvantages of the conventional crystallization process which has been progressed while repeating trial and error with no existence of a technique applicable to any substance due to the provision of various properties as described above.

Specifically, the object of the present invention is to provide a technique of reducing the effect of convection in a solution caused by the effect of gravity and controlling nucleation in crystallization of various biological macromolecules and biological tissues mainly composed of biological macromolecules.

Another object of the present invention is to provide a technique which can suppress or control mass formation of microcrystals and obtain a large-sized crystal capable of X-ray structural analysis.

Still another object of the present invention is to provide a technique for enabling crystallization with a small amount of biological macromolecule solution.

A further object of the present invention is to provide a method and an apparatus for enabling crystallization with a small amount of solution.

The present invention is directed to a method of growing a crystal of a macromolecule contained in a solution, which comprises a step of providing a solid-state component, whose valence electrons are controlled so that the concentration of holes or electrons in the surface part can be controlled in response to the environment of the solution containing the macromolecule, and which has at least two grooves or holes whose depths and/or widths of the opening parts differ from each other, and a step of bringing the solid-state component into contact with the solution containing the macromolecule and making the grooves or holes hold the solution. In the solid-state component, the valence electrons are so controlled that crystallization of the macromolecule is facilitated inside rather than outside the grooves or holes. This method grows a crystal of the macromolecule in the grooves or holes holding the solution under an electrical state which is brought to the surface of the solid-state component by the controlled valence electrons.

An impurity doped semiconductor substrate may be employed as the solid-state component. At least two grooves or holes whose depths and/or widths of the opening parts differ from each other are formed on the semiconductor substrate.

In the semiconductor substrate, the type and/or the concentration of the doped impurity in the inside portion of the grooves or holes may be different from that in the outside portion of the grooves or holes, in order to facilitate crystallization of the macromolecule inside rather than outside the grooves or holes.

The present invention provides a solid-state component for controlling crystal growth. This solid-state component has at least two grooves or holes whose depths and/or widths of the opening parts differ from each other. In the solid-state component, valence electrons are controlled so that the concentration of holes or electrons in the surface part can be controlled in response to the environment of a solution containing a substance to be crystallized, and the controlled mode of the valence electrons in the inside portion of the grooves or holes is different from that in the outside portion of the grooves or holes.

As such a solid-state component, an impurity doped semiconductor substrate may be employed as described above. The type and/or the concentration of the doped impurity in the inside portion of the grooves or holes formed on the semiconductor substrate may be different from that in the outside portion of the grooves or holes.

In a preferred aspect of the present invention, a crystal growth method comprises a step of providing a solid-state component whose valence electrons are controlled so that the concentration of holes or electrons in the surface part can be controlled in response to the environment of a solution containing a macromolecule, and a step of bringing the solid-state component into contact with the solution containing the macromolecule, wherein the solid-state component has at least two grooves or holes whose depths and/or widths of the opening parts differ from each other, and which are formed on one of the opposed two principal surface sides, and the solid-state component also has a through hole for supplying the solution containing the macromolecule into the grooves or holes from the other of the two principal surface sides. In the part of the solid-state component coming into contact with the solution, the valence electrons are so controlled that crystallization of the macromolecule is facilitated inside rather than outside the grooves or holes. Such a solid-state component is employed, and the solution containing the macromolecule is supplied into the downwardly directed grooves or holes through the through hole. Thus, the grooves or holes are made to hold the solution in such a state that a droplet of the solution hangs down in the direction of gravity on the solid-state component. In the grooves or holes thus holding the solution, a crystal of the macromolecule is grown under an electrical state which is brought to the surface of the solid-state component by the controlled valence electrons.

In the present invention, the aforementioned solid-state component may be an impurity doped semiconductor substrate. The type and/or the concentration of the impurity in the semiconductor substrate may differ between the inside and the outside portions of grooves or holes formed on the semiconductor substrate.

A water-repellent layer may be provided on the solid-state component to surround the formed plurality of grooves or holes.

In the present invention, growth of the crystal in the grooves or holes holding the solution may be carried out in the presence of a precipitant absorbing vapor of a solvent contained in the solution or in the presence of a buffer solution for holding gas-liquid equilibrium as to the solution.

In a preferred aspect of the present invention, the solid-state component to be employed for crystal growth is that whose valence electrons are controlled so that the concentration of holes or electrons in the surface part can be controlled in response to the environment of a solution containing a substance to be crystallized. The solid-state component has two opposed principal surfaces, and has at least two grooves or holes whose depths and/or widths of the opening parts differ from each other, and which are formed on one of the two principal surfaces. The solid-state component also has a through hole for supplying a solution containing a macromolecule into the grooves or holes from the other of the two principal surfaces. In the part of the solid-state component with which the solution is brought into contact, the valence electrons are so controlled that crystallization of the macromolecule is facilitated inside rather than outside the grooves or holes.

Such a solid-state component may be an impurity doped semiconductor substrate. A plurality of grooves or holes whose sizes differ from each other are formed on the semiconductor substrate, and the types and/or the concentrations of the impurities in the semiconductor substrate are different between the inside and the outside portions of the grooves or holes.

On such a solid-state component, a water-repellent layer may also be provided to surround the plurality of grooves or holes.

The present invention further provides a crystal growth apparatus, which comprises the aforementioned solid-state component, means for supporting the solid-state component, and a container which can house the solid-state component and the means in a closed state with a precipitant or a buffer solution.

In a preferred aspect of the present invention, a crystal growth method comprises a step of providing a plurality of solid-state components, whose valence electrons are controlled so that the concentrations of holes or electrons in the surface parts can be controlled in response to the environment of a solution containing a macromolecule, and which have at least two grooves or holes whose depths and/or widths of the opening parts differ from each other, a step of opposing the surfaces formed with the grooves or holes of the plurality of solid-state components to each other and holding the plurality of solid-state components with a given clearance, and a step of making the clearance hold the solution containing the macromolecule and bringing the solution into contact with the surfaces formed with the grooves or holes of the plurality of solid-state components.

In the solid-state components, the valence electrons are so controlled that crystallization of the macromolecule is facilitated inside rather than outside the grooves or holes. This method grows a crystal of the macromolecule in the grooves or holes holding the solution under an electrical state which is brought to the surfaces of the solid-state components by the controlled valence electrons.

Impurity doped semiconductor substrates may be employed as the solid-state components. At least two grooves or holes whose depths and/or widths of the opening parts differ from each other are formed on the semiconductor substrates. In these semiconductor substrates, the types and/or the concentrations of the doped impurities in the inside portion of the grooves or holes may be different from those in the outside portion of the grooves or holes, in order to facilitate crystallization of the macromolecule inside rather than outside the grooves or holes.

In the step of holding the plurality of solid-state components with a clearance, the solid-state components may be so held that the distance between the opposed solid-state components continuously reduces or increases.

In a preferred aspect of the present invention, an apparatus comprises a plurality of solid-state components, whose valence electrons are controlled so that the concentrations of holes or electrons in the surface parts can be controlled in response to the environment of a solution containing a macromolecule, and which have at least two grooves or holes whose depths and/or widths of the opening parts differ from each other, and means for opposing the plurality of solid-state components to each other and holding the same with a given clearance. The controlled mode of valence electrons in the inside potion of the grooves or holes of the solid-state components is different from that in the outside portion of the grooves or holes of the solid-state components. In the apparatus of the present invention, the aforementioned impurity doped semiconductor substrates may be employed as the solid-state components. The types and/or the concentrations of the doped impurities may be different between the inside and the outside of the grooves or holes formed on the semiconductor substrates.

The apparatus according to the present invention may further comprise a container which can house the plurality of solid-state components and the means for holding the same in a closed state with a desiccant or a buffer solution, and means for supporting the solid-state components in this container.

In the apparatus according to the present invention, the solid-state components may be so arranged that the distance between the opposed solid-state components continuously reduces or increases.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22A and FIG. 22B are diagrams schematically showing the states of crystal growth in the case where convection is present in a solution and in the case where no convection is present.

FIG. 23 is a schematic sectional view showing another example of the apparatus for crystal growth according to the present invention employing a plurality of solid-state components.

DETAILED DESCRIPTION OF THE INVENTION

In most of biological macromolecules such as protein, intermolecular recognition is made by a geometrically specific structure and electrostatic interaction (electrostatic repulsive force and attraction, and van der Waals force) in a solution. In the intermolecular interaction based on electrostatic energy, it is predicted that slight difference between space charge distributions on individual molecular outermost surfaces exerts decisive influence on the degree of the intermolecular recognition and easiness of formation of a molecule aggregate. Therefore, it is conceivable that, among individual molecules repeating collision while making Brownian movement in a solution, a nucleus of a molecular aggregate having a periodic and regular structure is extremely hard to form. Further, it is conceivable that, even if a crystal nucleus is formed, it comes to that respective molecules aggregating around the nucleus are loosely bonded to each other to result in low crystallinity when the molecular structures and charge distributions on the respective molecular surfaces are not identical to each other but have redundancy.

As regards crystal formation of protein molecules, it has been reported that an initial process of nucleation is important. Yonath et al. have observed an initial crystallization process of a gigantic ribosomal subunit extracted from *Bacillus Stearothermophilus* with an electron microscope. According to this, they state that progress of crystallization requires that respective molecules aggregate in a two-dimensionally regular structure (network, stellate or zigzag lattice) in the initial process (Biochemistry International, Vol. 5, 629–636 (1982)).

It is not clear whether or not this is indispensable to all substances in common. However, protein molecules are generally hard to aggregate since the intermolecular interaction is weak and the molecular surfaces are locally charged. Taking this into consideration, it is conceivable that, if some conditions for two-dimensionally arranging the molecules are set to form a nucleus in the initial process of crystallization, subsequent crystallization may epitaxially progresses based on the nucleus.

Figure 1A:
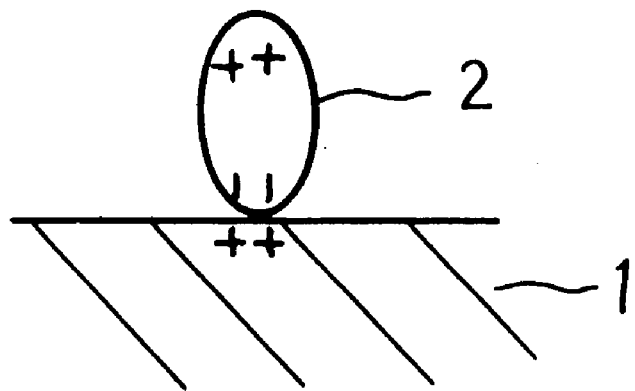
FIG. 1A and FIG. 1B are schematic diagrams illustrating a state that a crystal nucleus is fixed to the surface of the solid-state component and crystal growth progresses in accordance with the present invention.
Figure 1B:
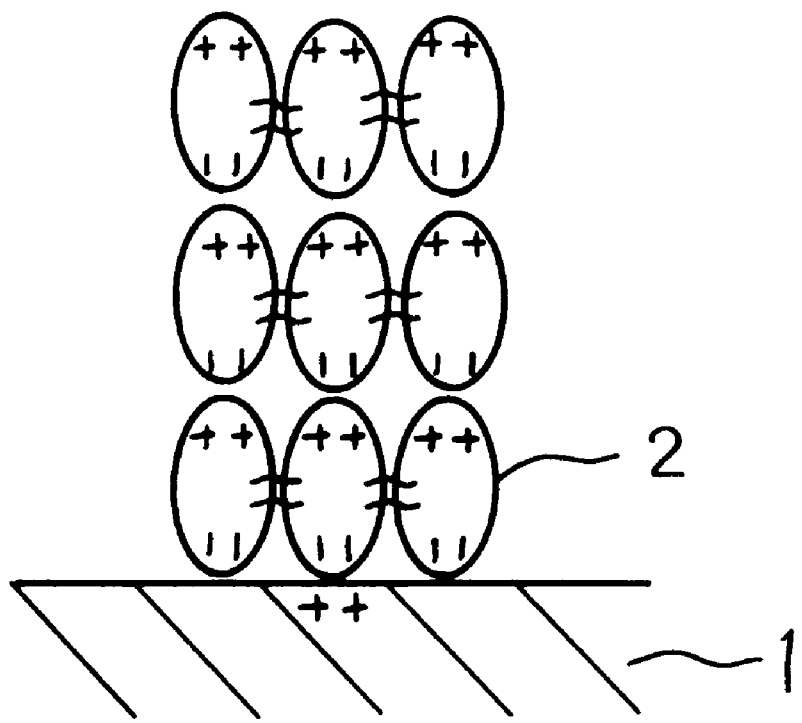

In the present invention, in order to stably form a crystal nucleus, a solid-state component whose valence electrons are controlled is brought into contact with a solution containing a substance to be crystallized. The solid-state component can control the concentration of electrons and holes by valence electron control from the surface coming into contact with the solution toward the inside, or in a section of the solid-state component, so that the electrical state on the surface of the solid-state component can be controlled. For example, FIG. 1 schematically shows such a state that a crystal nucleus is fixed on the solid-state component surface and a crystal grows in accordance with the present invention. As shown in FIG. 1A, a crystal nucleus 2 is fixed by electrostatic action to the surface of a solid-state component 1 which is brought into a prescribed electrical state, due to valence electron control. As shown in FIG. 1B, a compound such as protein aggregates on the solid-state component surface by electrostatic interaction, and formation of crystal nuclei is facilitated or accelerated, resulting in crystal growth. Therefore, controlling the electrical properties of the solid-state component surface can control crystallization. For example, the type, amount, arrangement density and the like of the crystal nucleus fixed to the solid-state component surface can be adjusted by valence electron control, so that crystallization can be controlled. The formed crystal nuclei are fixed to the solid-state component surface. Thus, it is also expected that small movement of the nuclei caused by convection or the like in the solution is suppressed, and the molecules regularly aggregate owing to the formation of the nuclei, so that the crystallinity improves. Even if charge distributions on the surfaces of the molecules to be crystallized are slightly changed due to change of pH of the solution or denaturation of the molecules, it is expected that space charges compensating for effective surface charges of the molecules are necessarily induced in the solid-state component surface, so that two-dimensional formation of the crystal nuclei can readily and preferentially be achieved.

As described later in more detail, a region substantially isotropically exerting electrostatic interaction with respect to the molecules to be crystallized can be formed on a bottom portion of a groove formed in the solid-state component. When a crystal nucleus is formed on the bottom portion of the groove, the crystal nucleus can be fixed by electrostatic interaction in such a region, and the crystal nucleus can be protected against convection based on the effect of gravity. Namely, the crystal nucleus can stand still on the bottom portion of the groove by electrostatic interaction. If a crystal grows based on the nucleus substantially standing still, it is expected that excessive formation of microcrystals is suppressed and a large-sized crystal in which the molecules regularly aggregate on the surface of the crystal nucleus can be obtained.

In the present invention, further, a plurality of grooves or holes whose widths of the opening parts and/or depths differ from each other are formed on the solid-state component. It is conceivable that the proper sizes of the grooves or holes vary with the sizes, charge characteristics etc. of the molecules to be crystallized. When plurally forming grooves or holes whose sizes differ from each other on the solid-state component in advance, therefore, more proper conditions for crystallization can be implemented in at least one of the grooves or holes. Even if the molecular species to be crystallized changes, there would necessarily exist a groove or hole suitable to the conditions for crystallization, and a single solid-state component can be applied to crystallization of various molecules.

Aggregateness of charged substances or molecules in an electrolytic solution generally depends on the sum of electric double layer repulsive force and van der Waals force therebetween, and hence it is extremely important to control the concentration of salt added into the electrolytic solution for adjusting a surface potential in allowing aggregation of the substances or the molecules. According to the present invention, the electrostatic property of the solid-state component surface can be previously adjusted by valence electron control. According to the present invention, a surface potential based on a space charge layer induced in the solid-state component surface is changeable in proportion to the concentration of the impurities added for controlling the valence electrons, for example. Therefore, the electrostatic property brought to the component surface can be adjusted beforehand by adjusting the impurity concentration in the solid-state component. The present invention, therefore, also bring out a merit that adjustment of the salt concentration in the electrolytic solution becomes easy or unnecessary.

Any substance may be employed as the solid for such an object as far as such a substance has the aforementioned electrostatic property, allows charge amount and polarity to be controlled and is chemically stable in a solution. A silicon crystal may be one of the most suitable materials for attaining this object. The mechanism of crystallization expected in the case of employing a silicon crystal will be described below. However, the mechanism described below can also be applied to another solid-state component employed in accordance with the present invention.

Figure 2:
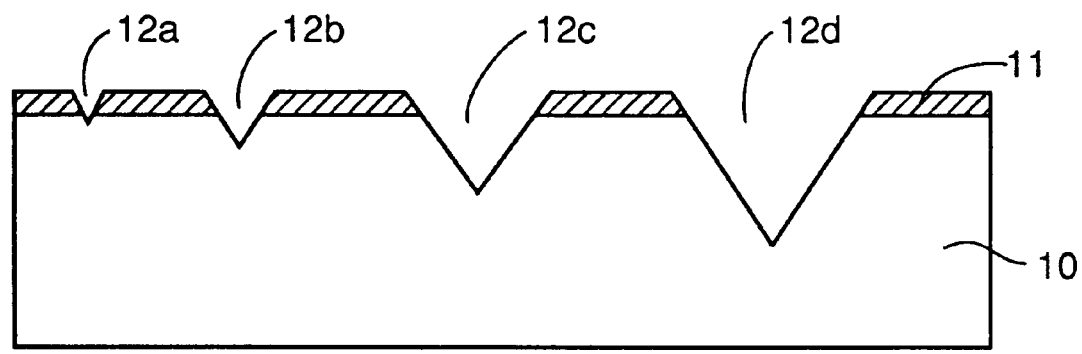
FIG. 2 is a schematic sectional view showing one example of the solid-state component according to the present invention.
Figure 3:
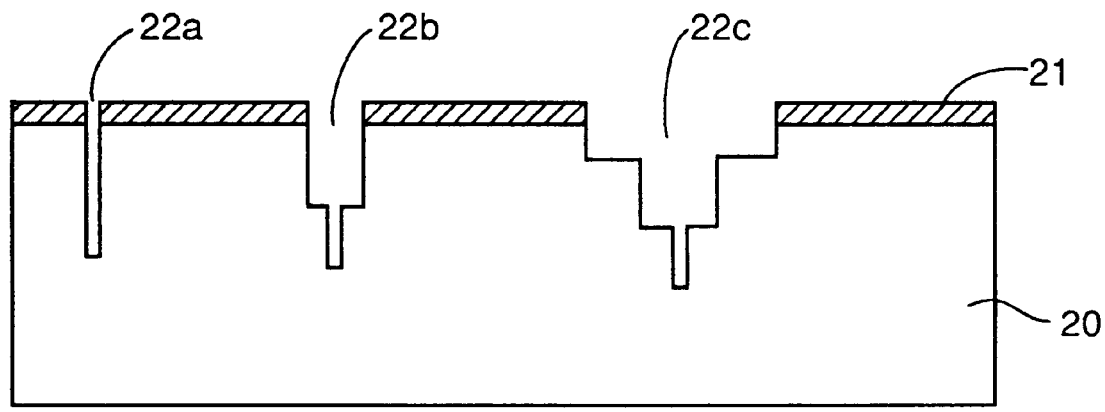
FIG. 3 is a schematic sectional view showing another example of the solid-state component according to the present invention.
Figure 4A:
FIGS. 4A, 4B, 4C, 4D, 4E, and 4F are schematic sectional views illustrating a process for forming the solid-state component of FIG. 2.
Figure 4B:
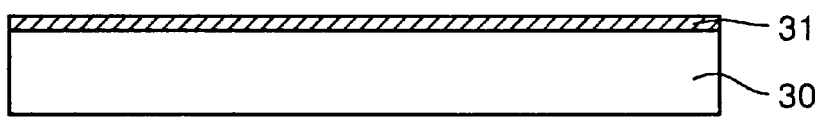
Figure 4C:
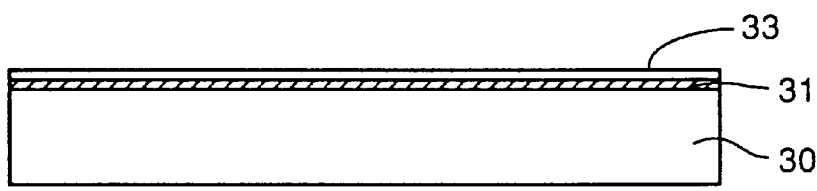
Figure 4D:
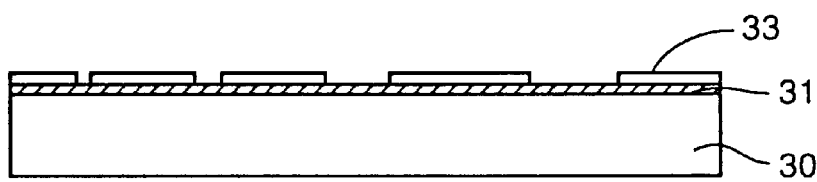
Figure 4E:
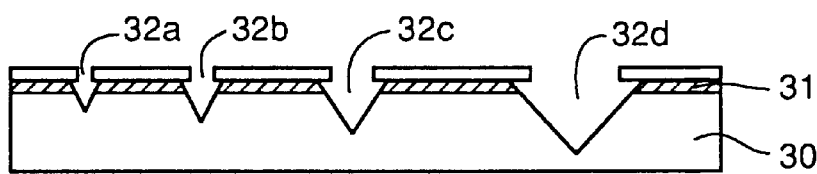
Figure 4F:
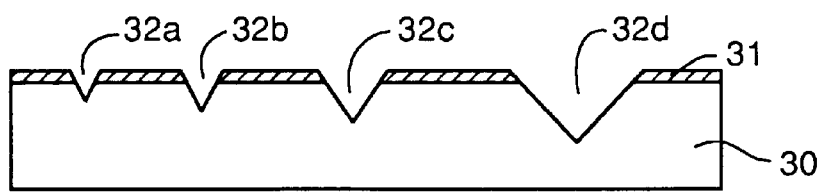
Figure 5A:
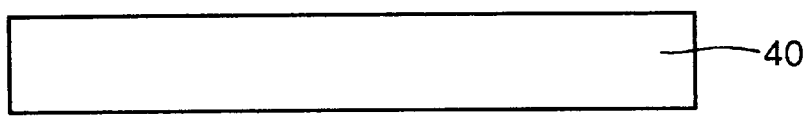
FIGS. 5A, 5B, 5C, 5D, 5E are schematic sectional views illustrating a process for forming the solid-state component of FIG. 3.
Figure 5B:
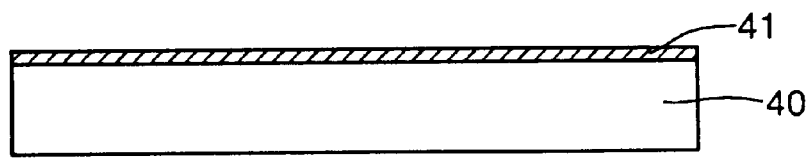
Figure 5C:
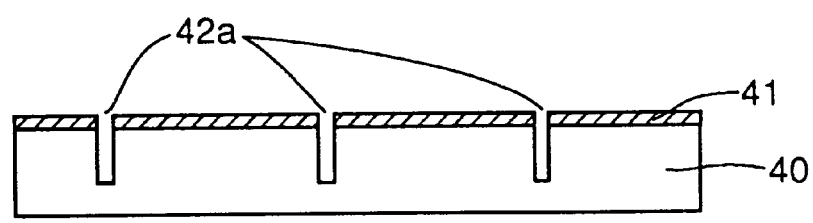
Figure 5D:
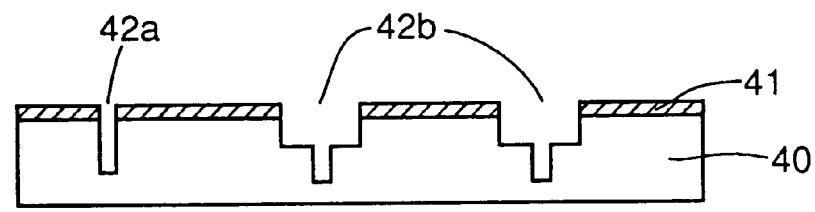
Figure 5E:
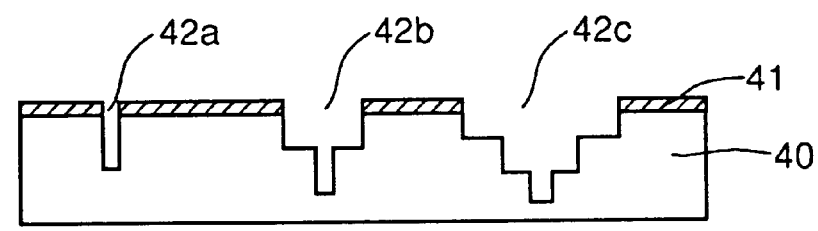

Outlines of structures of solid-state components for crystal growth according to the present invention are shown in FIG. 2 and FIG. 3. The solid-state component shown in FIG. 2 is directed to crystallization of a macromolecule dissociating and having negative effective surface charge in a solution. In the component, an N-type silicon layer 11 is formed on the surface of a P-type silicon substrate 10. A plurality of V-shaped grooves (V-grooves) 12a, 12b, 12c and 12d are also formed in the surface. Depths and widths of the opening parts in the respective V-grooves differ from each other. The solid-state component shown in FIG. 3 is also directed to crystallization of a macromolecule having a similar dissociation characteristic. An N-type silicon layer 21 is formed on the surface of a P-type silicon substrate 20. A plurality of concave grooves 22a, 22b and 22c are formed in the surface. Widths of the opening parts in the respective grooves differ from each other. The groove 22a is a well-shaped or prismatic groove whose depth is remarkably longer than the width of the opening part. The grooves 22b and 22c have stepwise inner walls. The widths of the opening parts are narrower at deeper levels of the grooves. Such grooves having narrower widths of the opening parts at deeper portions are more preferable. With respect to a macromolecule having a dissociation characteristic reverse to the above, the polarity of a silicon substrate may be reversed to that shown in FIG. 2 or 3. Namely, in the case of aiming at crystallization of a macromolecule having positive effective charge in a solution, a component having a P-type silicon layer on an N-type silicon substrate may be employed. In any component, the substrate surface is exposed in the grooves. Namely, in the component shown in FIG. 2 or FIG. 3, the N-type silicon layer is formed at the portions coming into contact with the solution outside the grooves, while the inner walls of the grooves are composed of the P-type silicon substrate. In the case of similarly forming a P-type silicon layer on an N-type silicon substrate, the inner walls of the grooves are composed of an N-type silicon substrate, and portions coming into contact with a solution outside the grooves are provided with a P-type silicon layer.

FIG. 4 shows an outline of a process for forming the component shown in FIG. 2. First, a P-type silicon substrate 30, whose surface is cleaned and mirror-polished, for example, is prepared (FIG. 4A). Then, an N-type silicon layer 31 is formed on the surface of the P-type silicon substrate 30 b by ion implantation or the like (FIG. 4B). Thereafter a silicon oxide film (SiO$_2$) 33 is formed by CVD or the like (FIG. 4C). Then, after performing a proper step such as lithography, necessary portions of the silicon oxide film are removed for forming grooves (FIG. 4D). By etching the portions not covered with the oxide film, grooves 32a, 31b, 32c and 32d are formed (FIG. 4E). By removing the silicon oxide film, the desired solid-state component is obtained (FIG. 4F). Although not illustrated, a silicon oxide film may be formed on the overall surface of the solid-state component again after removing the silicon oxide film.

FIGS. 5 show an outline of a process for forming the solid-state component shown in FIG. 3. First, a P-type silicon substrate 40 is prepared (FIG. 5A). Then, an N-type silicon layer 41 is formed on the substrate 40 by ion implantation or the like (FIG. 5B). After performing proper lithography or the like, grooves 42a are formed at prescribed portions by diy etching (FIG. 5C). In the portions where the openings of the grooves are to be wider, dry etching is repeated to form a plurality of grooves 42b and 42c, which are anisotropically deep, whose areas of the openings differ from each other (FIGS. 5D and E).

Such a mechanism that crystallization is controlled with the solid-state component of the present invention is hereafter described. When bringing an electrolytic aqueous solution containing a macromolecule dissociating and having negative effective surface charge into contact with an N- or P-type silicon crystal having valence electrons controlled, a Schottky barrier is formed with respect to an N-type silicon surface, while ohmic contact is obtained with respect to a P-type silicon surface. On the P-type silicon surface, holes are regularly supplied from the bulk silicon side to the macromolecular electrolyte having negative charge (ohmic property), and hence it is expected that the macromolecules regularly continuously aggregate on the silicon surface. On the other hand, a surface potential dependent on the electrolyte concentration of the solution is generated on the surface of the N-type silicon, while a space charge layer region is formed in the inside. The space charge amount also depends on the dopant concentration of the N-type silicon. Therefore, it is expected that the macromolecules having negative charge in the electrolytic solution continuously aggregate on the silicon surface until at least compensating for the positive space charge owned by the N-type silicon. It is expected that on the surface of the silicon in which the space charge layer region is formed, aggregation and crystallization of the macromolecule limitedly take place. On the other hand, it is expected that on the surface of the P-type silicon with which ohmic contact is formed, aggregation of the macromolecule unlimitedly progresses.

In addition, when at least two regions whose impurity concentrations differ from each other are formed in N-type silicon, for example, it is expected that these regions bring out crystallization in different modes. As described below, the effects are different between the case that the N-type silicon has low impurity concentration and high resistance and the case that the N-type silicon has high impurity concentration and low resistance. In the N-type silicon of a low impurity concentration (or high resistance), a depletion layer capacity is small due to the fact that the width of a space charge layer formed in the vicinity of the surface widens since the dopant concentration is low. Therefore, it is expected that a surface potential induced in the N-type silicon of a low impurity concentration is larger than that induced in the N-type silicon of a high impurity concentration (or low resistance). The surface potential is reverse in polarity to the effective surface potential owned by the macromolecule, whereby aggregation of the molecules is accelerated by the action of electrostatic attraction. Namely, it is expected that the N-type silicon substrate of a low impurity concentration and high resistance can deposit more crystals on its surface than the N-type silicon substrate of a high impurity concentration and low resistance.

While the above description deals with the molecules having negative effective surface charge in a solution, a similar effect on the molecules having positive effective surface charge can be expected.

Formation of regions, which are spatially different in resistance from each other, can be readily attained by selectively doping the silicon surface with impurities. As another method, etching the silicon surface may expose surfaces whose resistance values differ from each other.

The N-type and P-type silicon crystals employed for the present invention may be those having characteristics equivalent to those of a silicon wafer employed for a general LSI process. The specific resistance of the silicon crystals may be within the range of about 0.0001 to 1000 Ωcm, and more preferably within the range of 0.001 to 100 Ωcm. Various types of methods may be employed for preparing the N type or P type silicon having valence electrons controlled. Ion implantation may be most convenient and capable of accurately controlling impurity concentration. In this case, valence electron control of the P type and the N type can be readily performed by injecting ions of elements belonging to the group III and the group V of the periodic table into silicon and annealing respectively. The group III elements for bringing silicon into the P type may include B, Al, Ga, In, Tl and the like. B is particularly general. The group V elements for bringing silicon into the N type may include N, P, As, Sb, Bi and the like, and P, As and Sb are particularly general. It is preferable that the surfaces of the crystals are mirror-polished, in order to control deposition of crystal nuclei.

In the present invention, the thickness of the layer containing impurities formed on the silicon substrate surface is preferably 0.1 to 200 μm, and more preferably in the range of 1 to 50 μm. The other thickness range is not so preferable because of difficulty of preparation or loss of the effect.

While the above description has been made as to the embodiment employing semiconductor crystal silicon in which valence electron control is easy, other materials having similar functions may be properly employed in order to attain the objects. For example, semiconductor crystals other than silicon may also be preferably employed, and materials other than the semiconductor crystal, such as inorganic compounds, organic compounds, macromolecules and complexes of these whose charge distribution is controlled can be listed as the candidates.

In the present invention, pluralities of grooves or holes are formed on the solid-state component. The component shown in FIG. 2 has V-grooves, and the component shown in FIG. 3 has concave grooves respectively. In place of the grooves, pyramidal or conical holes may be provided on the solid-state component surface, for example. It is more preferable for these grooves or holes that the widths of the openings narrow as approaching the deeper portions. In practical crystal growth, it is rather advantageous that the surface of a single component has a large number of grooves or holes in several sizes.

The solid-state component employed for crystallization is preferably applicable to any macromolecule. On the other hand, it is conceivable that the characteristics of the solid-state component as required vary with the sizes, charge characteristics and the like of the molecules to be crystallized. Therefore, it is conceivable that the sizes of the grooves or holes should be varied depending on the sizes, charge characteristics and the like of the molecules to be crystallized. Discretely preparing a solid-state component having grooves or holes for each targeted macromolecule, however, is costly and time-consuming, and this cannot be so efficient. When the solid-state component has plural grooves or holes of different sizes in advance, any of the grooves or holes should provide preferable conditions for crystallization even if the targeted molecular species changes. Therefore, it is possible to perform crystallization of various molecules with one solid-state component. Thus, the labor and the cost for solid-state component preparation are also reduced.

The sizes of the opening parts of the grooves or holes and the depths of the grooves or holes formed on the substrate surface may be set in a proper range depending on the type of the targeted macromolecules. In general, the widths of the opening parts of the grooves or holes are preferably in the range of 0.01 to 100 μm, and the lengths of the grooves are preferably in the range of 1 to 10 mm. Further, the plurality of grooves or holes may be conveniently arranged with a space within the range of 1 μm to 1 mm. The depths of the grooves or holes are preferably set in the range of 0.01 to 200 μm, for example. However, the sizes described above mainly come from restrictions on preparation of the solid-state component, and other sizes will not exert decisive bad influence on the performance of the solid-state component, i.e., crystallization.

Figure 6:
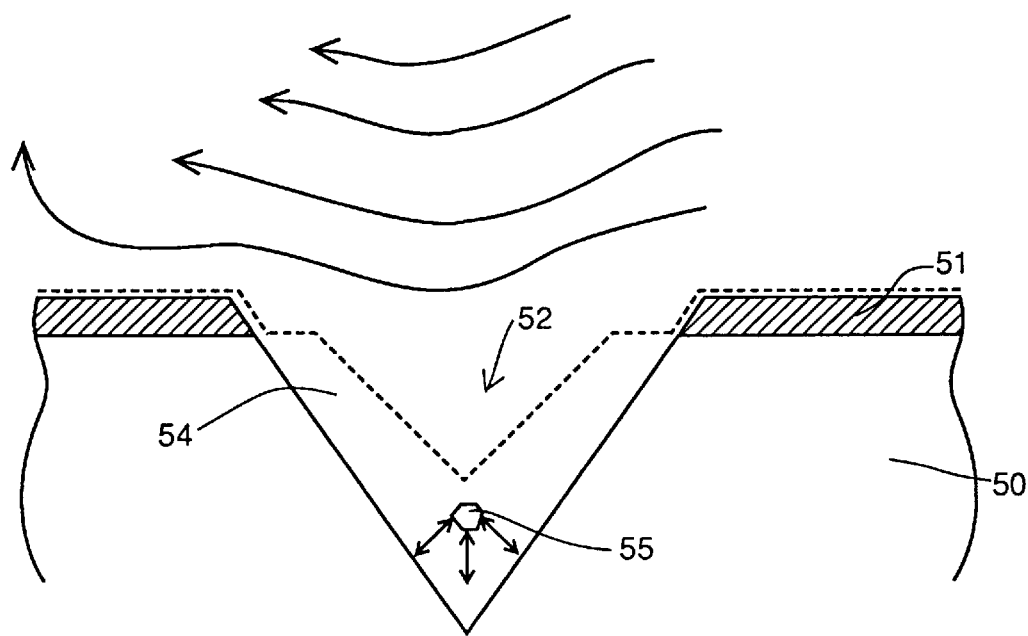
FIG. 6 is a schematic sectional view for illustrating how crystal growth progresses in a groove formed on the solid-state component.
Figure 7:
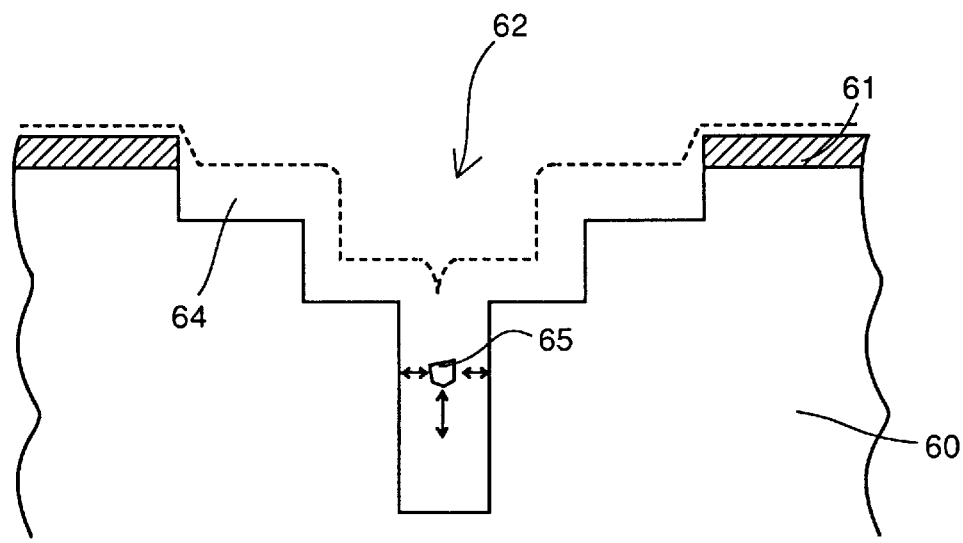
FIG. 7 is a schematic sectional view for illustrating how crystal growth progresses in a groove formed on the solid-state component.

FIG. 6 and FIG. 7 illustrate functions/effects of grooves or holes in crystal growth. As shown in FIG. 6, when bringing the solid-state component into contact with an electrolytic solution containing the molecules to be crystallized, it is expected that a V-groove part 52 consisting of P or P⁻ silicon generate a wider range where electrostatic interaction with the dissociating macromolecules is exerted (the range may be considered as the width of an electric double layer), than a surface part 51 consisting of an N or N⁺ silicon layer does. In the figure, a region 54 shown by dotted lines is the range where the electric interaction is exerted. Namely, the region 54 is thicker in the V-groove part 52 than on the surface part 51. In particular, it is expected that the width of the region 54 at the deepest central portion of the V-groove part 52 will be widest due to overlap of the affectable regions.

At the deepest portion of the V-groove part 52 consisting of P or P⁻ silicon, therefore, a crystal nucleus or a molecular aggregate 55 to be a crystal nucleus will substantially isotropically receive electrostatic attraction from the V-groove surface and be restrained in the V-groove. As to the molecular aggregate 55 which is present at a deep portion in the Vgroove, it is expected that formation of a crystal nucleus and growth of a crystal can stably take place because the influence of convection in the solution based on gravity is suppressed by the electrostatic attraction. On the surface part 51 consisting of N or N⁺ silicon, on the other hand, formation of a crystal nucleus is suppressed as described above. It is also conceivable that, even if a crystal nucleus is formed on this surface, reduction of crystallinity or reduction of the growth rate is brought because the width of the diffusion supply layer in the vicinity of the crystal nucleus fluctuates by the influence of the convection in the solution. Therefore, growth of the crystal selectively progresses in the groove part 52, and a large-sized crystal is obtained.

Also on the solid-state component shown in FIG. 7, it is conceivable that stable crystal growth takes place due to a similar mechanism. Namely, a crystal nucleus 65 is formed in the portion where the opening width of a groove part 62 is the narrowest, and restrained by electrostatic attraction. The width of a region 64 where electrostatic interaction is exerted is widest at the deepest portion of the groove part 62. On an N or N⁺ silicon layer 61 which is formed on a substrate 60, on the other hand, formation of a crystal is suppressed as described above. Therefore, at a deeper portion of the groove part 62, a crystal nucleus is formed and a crystal grows.

Figure 8:
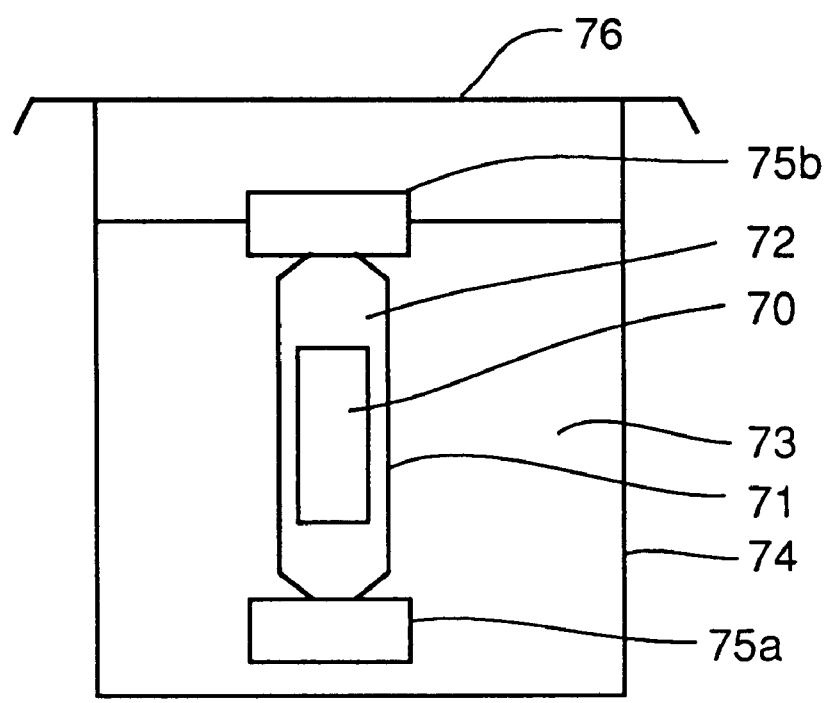
FIG. 8 is a schematic diagram showing one example of the apparatus for performing the crystal growth method of the present invention.

FIG. 8 shows a more specific apparatus for carrying out the present invention. In the apparatus shown in FIG. 8, a buffer solution 73 is stored in a container 74, and a dialysis membrane tube 71 is provided therein. In the dialysis membrane tube 71, a solid-state component for crystal growth, e.g., a silicon semiconductor substrate 70 as described above is placed together with a mother liquor 72 containing a macromolecule. The dialysis membrane tube 71 is sealed with closers 75a and 75b, and dipped in the buffer solution 73. An opening of the container 74 is covered with a lid 76. In this apparatus, dialysis is carried out, and a crystal of the macromolecules is deposited on the silicon semiconductor substrate 70 from the mother liquor 72. Besides this apparatus, another method and apparatus holding the mother liquor on a silicon substrate in the form of a droplet without a dialytic tube and performing crystallization are also applicable.

Figure 9A:
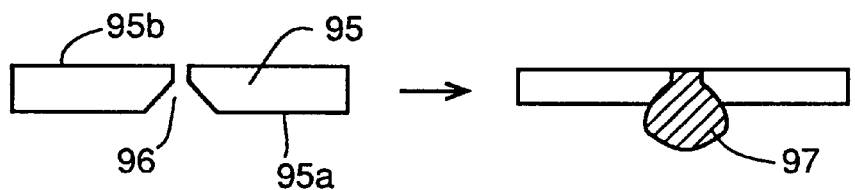
FIGS. 9A, 9B, 9C, 9D are schematic sectional views showing such a state that mother liquors are held on the surface of the solid-state component having a through hole and on the surface of the solid-state component having no through holes.
Figure 9B:
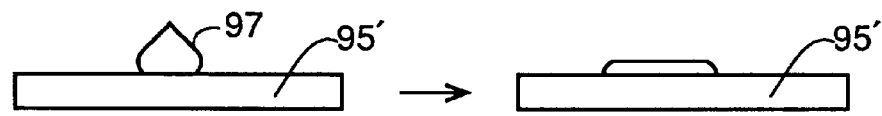
Figure 9C:
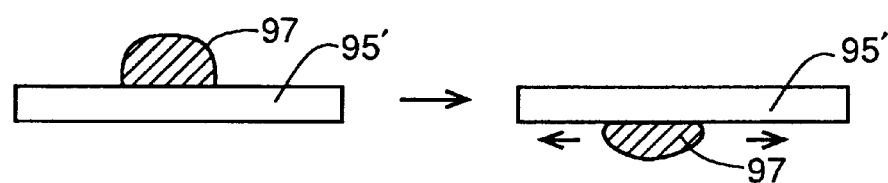
Figure 9D:
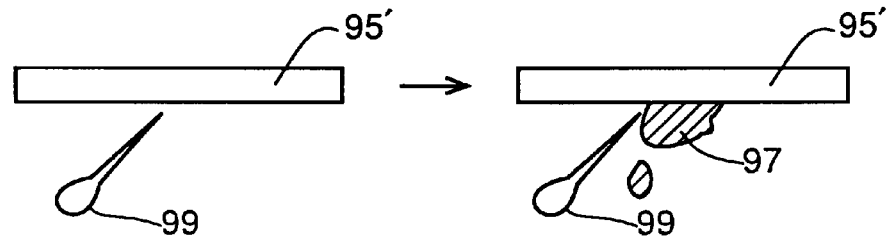

In the present invention, a through hole may be formed in the solid-state component. Assuming that a surface formed with the grooves or holes is the front surface and a surface opposed thereto is the rear surface in the solid-state component, the front surface and the rear surface of the solid-state component may be communicated with each other by the through hole. FIG. 9A shows an example of the solid-state component that is formed with a through hole. In a solid-state component 95 having a through hole 96, by injecting a mother liquor containing a compound to be crystallized from its rear surface 95b side into the through hole 96, a droplet 97 of the mother liquor can readily be formed on its front surface 95a due to the action of surface tension. The through hole allows the front surface of the solid-state component to hold a very small amount of solution. As described later, crystallization in such a droplet can be carried out with an extremely small amount of sample. A very small amount of droplet can be readily held when the same is brought into a state hanging down in the direction of gravity. In the case of dropping a mother liquor on a solid-state component 95' for forming a droplet as shown in FIG. 9B, on the other hand, a proper droplet may be formed or may not be formed depending on the wettability of the solid-state component surface with respect to the mother liquor. A droplet is hardly formed on a surface whose wettability is high. It is also difficult to form a droplet hanging down in the direction of gravity without a through hole. For example, as shown in FIG. 9C, it may be proposed that a droplet 97 be first placed on the surface of a solid-state component 95' and then the component 95' be turned over for bringing the droplet 97 into a state hanging down in the direction of gravity. In this case, however, it often happens that the liquor flows on the solid-state component 95' and the droplet cannot be held. As shown in FIG. 9D, it may also be proposed that a droplet be formed with a syringe 99 on the surface of a solid-state component 95' which is turned over. In this case, however, the liquor often drops downward, and it is difficult to make a regular amount of droplet held on the substrate. As described above, the through hole facilitates the formation of a droplet hanging down in the direction of gravity.

Figure 10A:
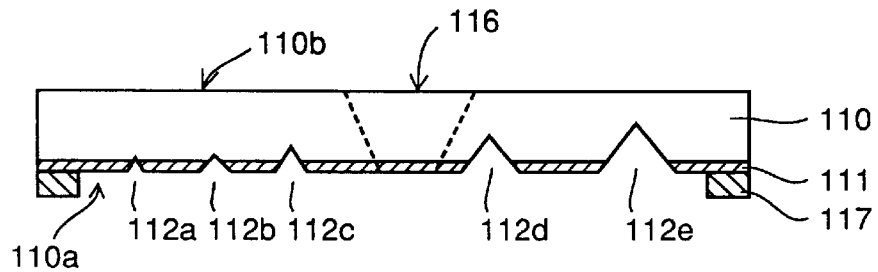
FIG. 10A is a schematic sectional view showing one example of the solid-state component of the present invention having a through hole.
Figure 10B:
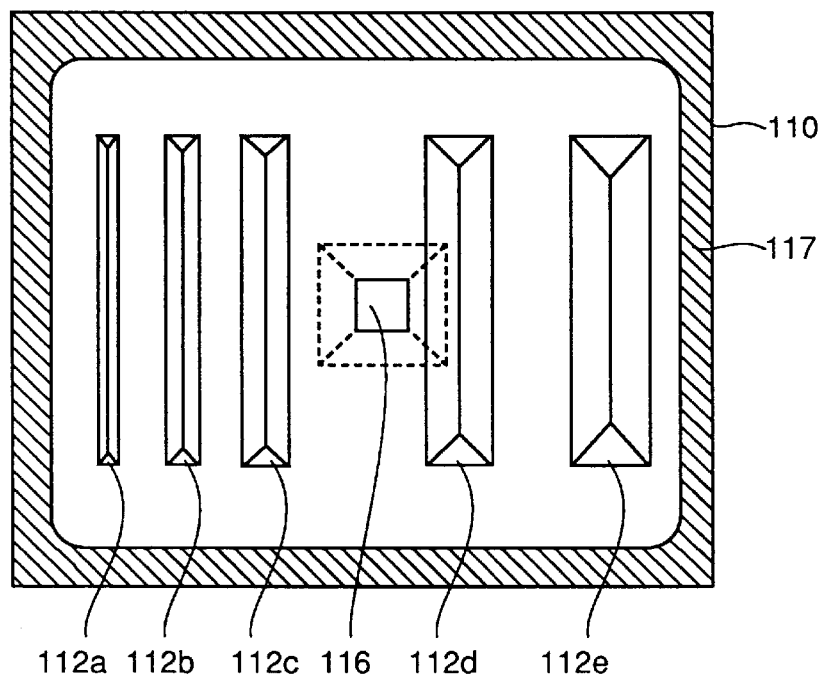
FIG. 10B is a plan view thereof.

FIG. 10A and FIG. 10B show an example of the solid-state component having a through hole in accordance with the present invention. FIG. 10A is a schematic sectional view thereof, and FIG. 10B is a schematic plan view thereof. The solid-state component is provided for the purpose of crystallization of a macromolecule dissociating and having negative effective surface charge in a solution. In the solid-state component, an N-type silicon layer 111 is formed on the surface of a P-type silicon substrate 110. On the front side 110a of the P-type silicon substrate 110, a plurality of V-shaped grooves (V-grooves) 112a, 112b, 112c, 112d and 112e whose widths of the opening parts and depths differ from each other are formed. A through hole 116 is formed at a substantially central portion of the silicon substrate 110 between the V-grooves 112c and 112d, so that liquor can be supplied from the rear side 110b of the substrate to the front side 110a. The opening part of the through hole 116 on the rear side is wider than the opening part on the front side. On the front side 110a of the silicon substrate 110, a water-repellent layer 117 consisting of water-repellent resin such as polyimide is also formed to surround the V-grooves 112a to 112e.

Figure 11:
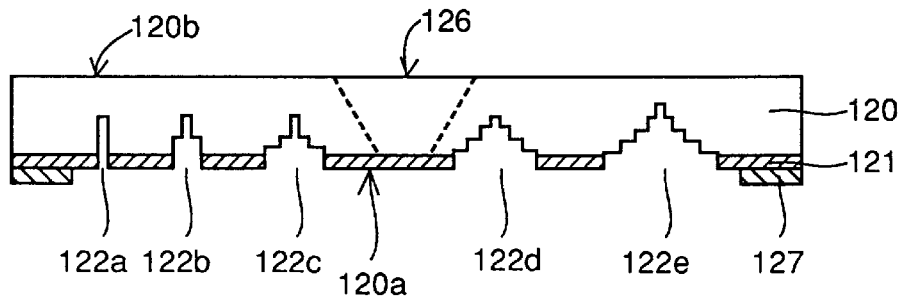
FIG. 11 is a schematic sectional view showing another example of the solid-state component of the present invention having a through hole.

FIG. 11 shows another example of the solid-state component having a through hole in accordance with the present invention. This solid-state component is also provided for the purpose of crystallization of a macromolecule dissociating and having negative effective surface charge in a solution. An N-type silicon layer 121 is formed on the surface of a P-type silicon substrate 120. A plurality of concave grooves 122a, 122b, 122c, 122d and 122e are also formed on its front side 120a. The groove 122a is a well-shaped or prismatic groove whose depth is longer than the width of the opening. On the other hand, the grooves 122b to 122e have stepwise inner walls. In these grooves, the width of the opening is narrower at deeper level. Such a solid-state component having grooves or holes whose widths of the opening parts are narrower at deeper level is more preferable. A through hole 126 is formed at the central portion of the silicon substrate 120 between the grooves 122c and 122d. The opening of the through hole 126 on the rear side 120b is wider than the opening on the front side 120a. On the front side 120a of the silicon substrate 120, a water-repellent layer 127 consisting of water-repellent resin is further formed to surround the five grooves.

In the solid-state components shown in the above, P-type silicon is exposed in the grooves, while the surface outside the grooves is covered with the N-type silicon layer. In such solid-state components, a solution sample is supplied to the front region formed with the plurality of grooves and covered with the water-repellent resin. In the case of crystallizing macromolecules dissociating and having positive effective charge in a solution, the polarities of the silicon substrate and the silicon layer are preferably reversed in the above described solid-state component. Namely, a P-type silicon layer is preferably formed on an N-type silicon substrate. In this case, the N-type silicon substrate is exposed in the grooves, while the surface outside the grooves is covered with the P-type silicon layer.

Figure 12A:
FIGS. 12A, 12B, 12C, 12D, 12E, 12F, 12G, 12H are schematic sectional views showing a process for forming the solid-state component of FIG. 10A and FIG. 10B.
Figure 12B:
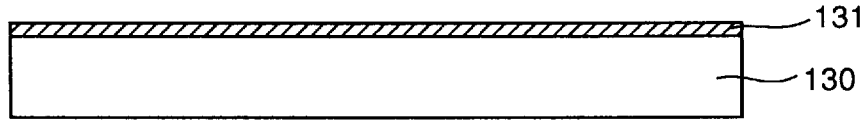
Figure 12C:
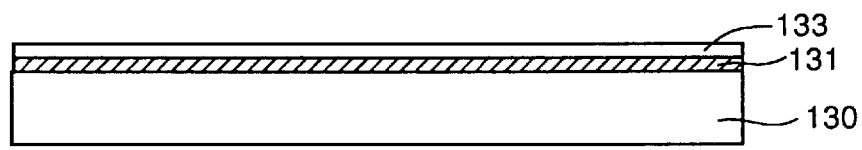
Figure 12D:
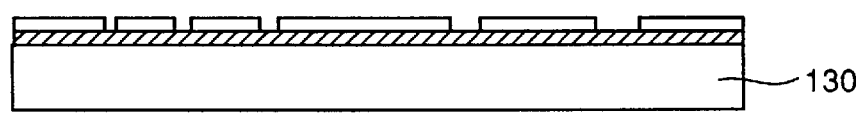
Figure 12E:
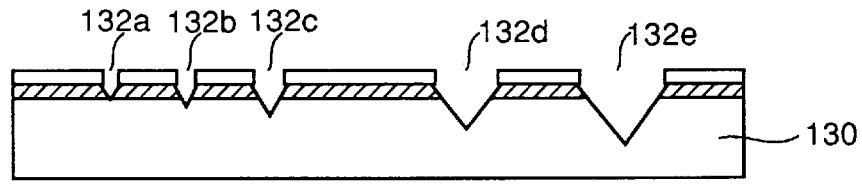
Figure 12F:
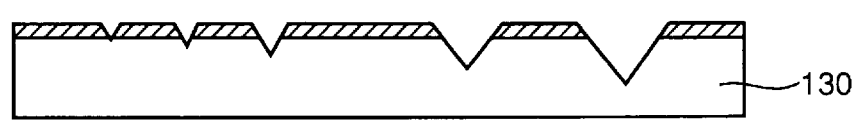
Figure 12G:
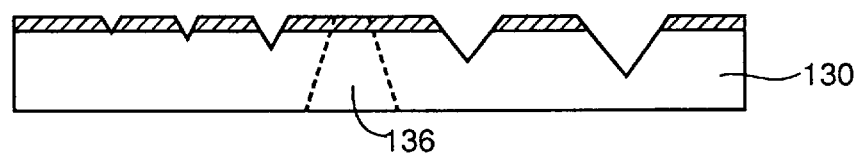
Figure 12H:
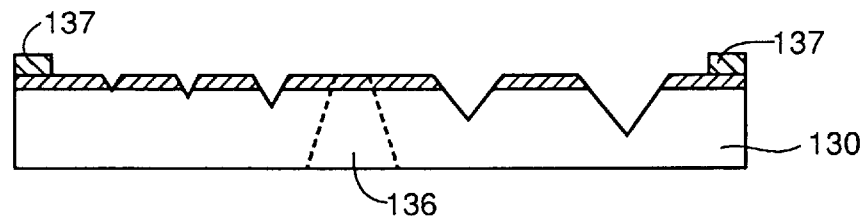

FIG. 12A to FIG. 12H are schematic sectional views showing a process for forming the solid-state component shown in FIG. 10A and FIG. 10B. First, a mirror-polished P-type silicon substrate 130 is prepared, for example (FIG. 12A). Then, an N-type silicon layer 131 is formed on the P-type silicon substrate 130 by ion implantation or the like (FIG. 12B). Thereafter a silicon oxide ($SiO_2$) film 133 is formed by CVD or the like (FIG. 12C). After a proper photolithographic step or the like, the parts of the silicon oxide film are removed for the formation of grooves (FIG. 12D). Then, V-grooves 132a, 132b, 132c, 132d and 132e whose sizes differ from each other are formed by etching the N-type silicon layer and the P-type silicon substrate in the portions where the silicon oxide film is removed (FIG. 12E). Then, the silicon oxide film is removed (FIG. 12F). Thereafter a through hole 136 is formed in the substrate 130 by anisotropic etching employing a KOH solution, or the like (FIG. 12G). Then, a water-repellent layer 137 consisting of water-repellent resin such as polyimide is formed to surround the grooves (FIG. 12H). Although not illustrated, a silicon oxide film may be formed on the surface of the solid-state component again after the step of removing the silicon oxide film. Further, the through hole may be previously formed at the beginning of the process.

Figure 13A:
FIGS. 13A, 13B, 13C, 13D, 13E, 13F, 13G are schematic sectional views showing a process for forming the solid-state component shown in FIG. 11.
Figure 13B:
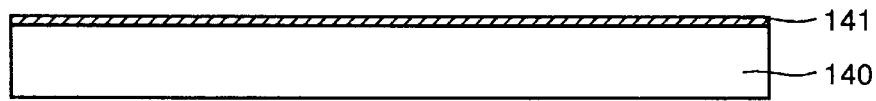
Figure 13C:
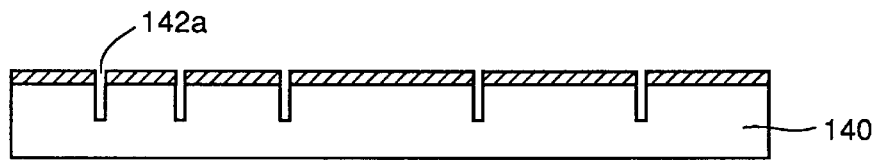
Figure 13D:
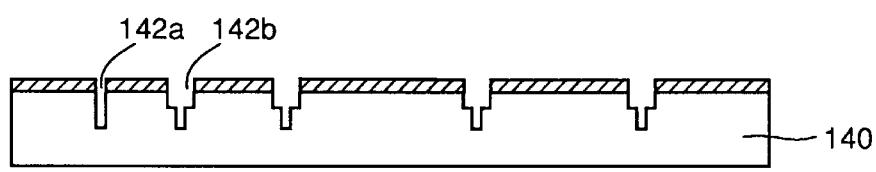
Figure 13E:
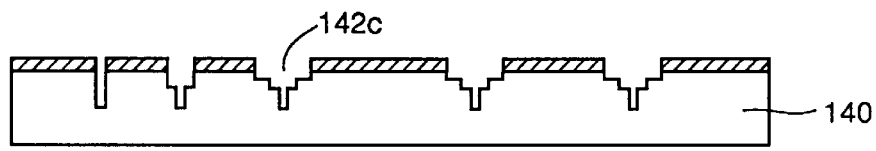
Figure 13F:
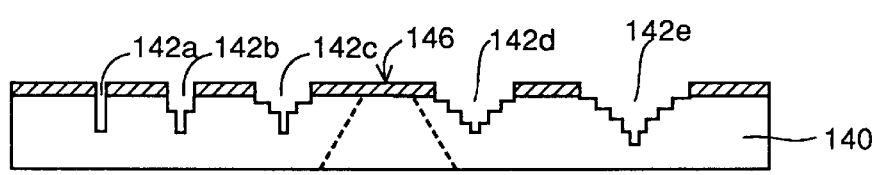
Figure 13G:
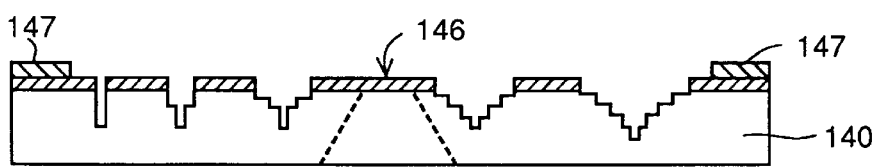

FIG. 13A to FIG. 13G show a process for forming the solid-state component shown in FIG. 11. First, a P-type silicon substrate 140 is prepared (FIG. 13A), and an N-type silicon layer 141 is formed by ion implantation or the like (FIG. 13B). After a proper photolithographic step or the like, a groove 142a whose aspect ratio is high is formed by dry etching (FIG. 13C). Concave grooves 142b, 142c, 142d and 142e which are anisotropically deep and different in width of the opening parts from each other are formed by further repeating the dry etching (FIG. 13D to FIG. 13F). Then, a through hole 146 is formed in the substrate 140 by anisotropic etching employing a KOH solution (FIG. 13F). Thereafter a water-repellent layer 147 consisting of water-repellent resin such as polyimide is formed to surround the grooves (FIG. 13G).

The component shown in FIG. 10A and FIG. 10B has V-grooves, and the component shown in FIG. 11 has concave grooves respectively. In place of the grooves, pyramidal or conical holes, for example, may be provided on the solid-state component surface. It is more preferable that these grooves or holes have the widths of the openings narrowed as approaching deeper portions. In practical crystal growth, it is advantageous that the surface of a single component has a large number of grooves or holes in several sizes.

In the present invention, a water-repellent layer may be formed on the solid-state component surface to surround the plurality of grooves or holes. This layer is adapted to prevent a droplet of the solution held on the solid-state component from flowing out to the periphery. For example, the silicon surface obtained by removing the surface oxide film is generally water-repellent with respect to pure water or water containing only acid or alkali, while the same loses its water repellence with respect to an aqueous salt-containing solution such as a buffer solution. Therefore, it is desirable that a layer consisting of a water-repellent material is formed around the region for holding the droplet so that the droplet of the aqueous salt-containing solution can be stably held. In order to attain such an object, organic resin may be employed as the water-repellent material. For example, polyimide may be one of the most conveniently employable materials. The water-repellent layer may be formed on the solid-state component by coating the same with photosensitive or non-photosensitive polyimide resin, hardening the resin and then removing unnecessary coating portions by etching or development to attain a desired pattern, for example.

While the thickness of the water-repellent layer employed in the present invention may not be functionally limited in particular, the range of 0.1 to 100 µm may be set as the thickness that is easy to prepare. The material is not limited to polyimide but any material may be employed so far as the same exhibits water repellence and is chemically stable against the solution. If the employed solution is repelled by the solid-state component of silicon or the like, however, such a water-repellent layer is unnecessary.

Figure 14:
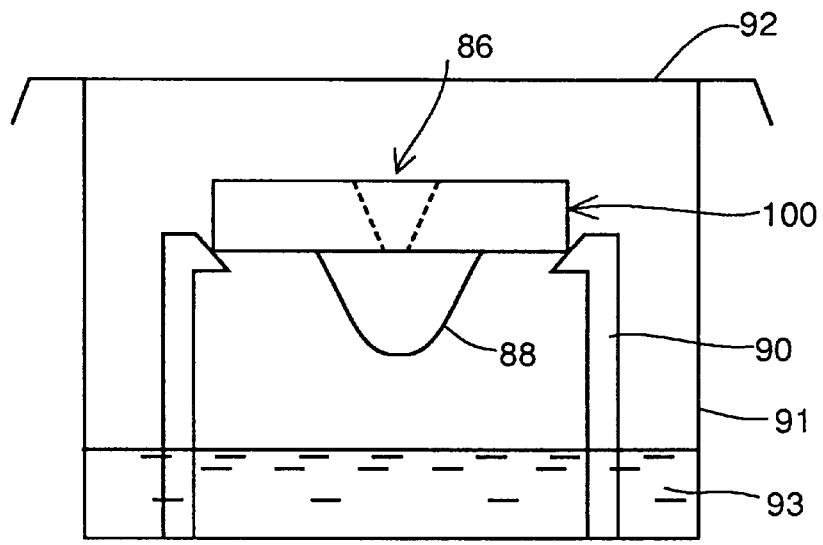
FIG. 14 is a schematic diagram showing one example of the crystal growth apparatus according to the present invention employing the solid-state component having a through hole.

FIG. 14 shows an example of the apparatus for crystal growth according to the present invention. In the apparatus shown in FIG. 14, a solid-state component 100 having a through hole 86 is supported by a mounting 90, and housed in a container 91. The opening of the container 91 may be sealed with a lid 92. In the apparatus, a droplet 88 of a mother liquor containing molecules to be crystallized is injected from the through hole 86 and held on the solid-state component 100 to hang down in the direction of gravity. A precipitant which can bring the molecules in the droplet into a supersaturated state by absorbing solvent vapor from the droplet 88, for example, moisture from an aqueous solution, or a buffer solution 93 for holding gas-liquid equilibrium as to the droplet is stored in the bottom of the container 91. When bringing the container 91 storing the precipitant or the buffer solution into a sealed state with the lid 92, crystallization will be accelerated in the droplet 88.

Figure 15:
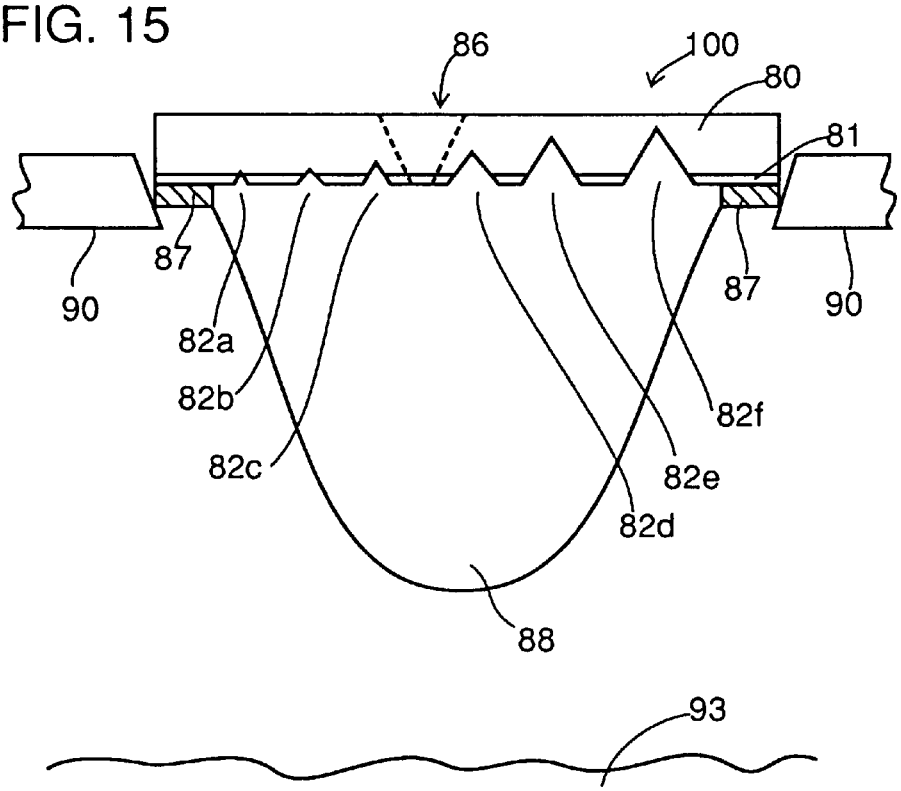
FIG. 15 is a schematic sectional view enlarging a principal part of the apparatus shown in FIG. 14.

FIG. 15 shows such a state that the droplet 88 is held on the solid-state component 100 in an enlarged manner. The solid-state component 100 is held by the mounting 90 above the precipitant or the buffer solution 93 stored in the container. On a substrate (e.g., a P-type silicon substrate) 80 forming the solid-state component 100, formed is a silicon layer (e.g., an N-type silicon layer) 81 whose impurity type or concentration is different from the substrate. A plurality of V-grooves 82a, 82b, 82c, 82d, 82e and 82f are also formed on the substrate 80. A water-repellent layer (e.g., a layer consisting of water-repellent resin) 87 is formed to surround these grooves. A through hole 86 for injecting the mother liquor is formed at a substantially central portion of the substrate 80. The solid-state component 100 is held on the mounting 90 while directing the V-grooves downward. When injecting the solution (mother liquor) containing molecules of protein or the like to be crystallized into the through hole 86 in a small amount from the rear side of the solid-state component with a pipette or the like, the mother liquor gradually shifts to the surface formed with the grooves, so that the droplet 88 is formed. Injection of the mother liquor is ended when the liquor reaches every groove without dripping from the surface of the solid-state component 100 and is stably held. As shown in FIG. 15, spreading of the mother liquor is prevented by the water-repellent layer 87, and the droplet 88 is stably held in a state hanging down in the direction of gravity. By holding the droplet in such a manner, the amount of the solution necessary for crystallization may be very small. In such an apparatus, growth of a crystal is performed in any groove as described above.

In the present invention, crystallization can also be performed with a smaller amount of solution by opposing a plurality of solid-state components with a prescribed space and making this clearance hold a solution containing molecules to be crystallized. While surface tension causing convection acts on the solution which is held in the clearance, influence of the surface tension can be suppressed due to the action of electrostatic attraction which is brought on the solid-state component surface, as described later.

Figure 16:
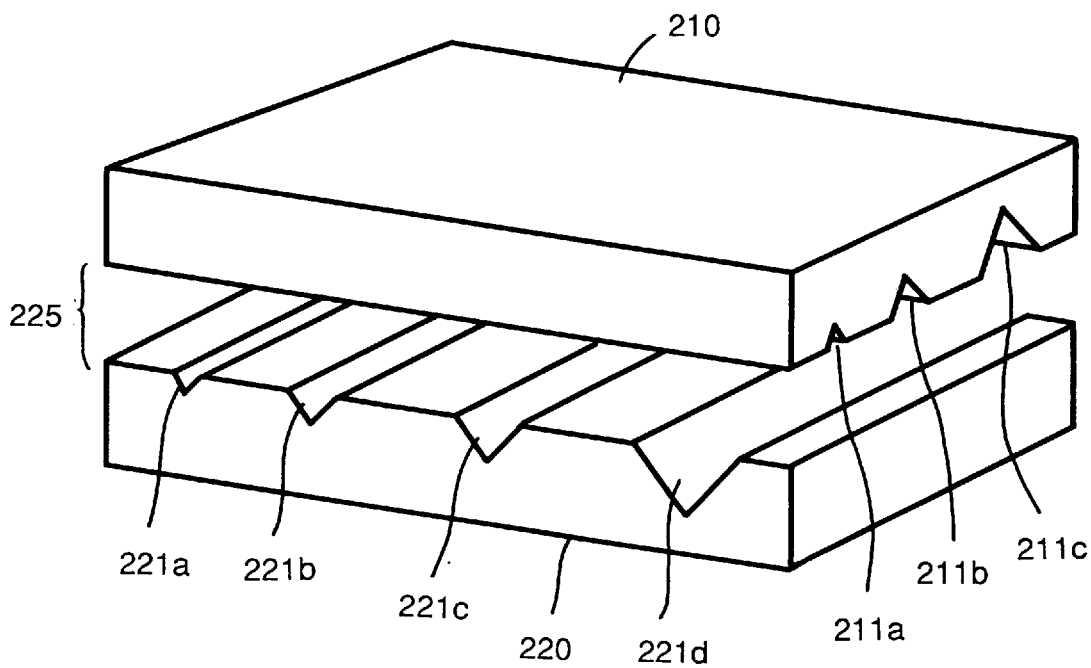
FIG. 16 is a perspective view showing one example of the apparatus for crystal growth according to the present invention employing a plurality of the solid-state components.
Figure 17:
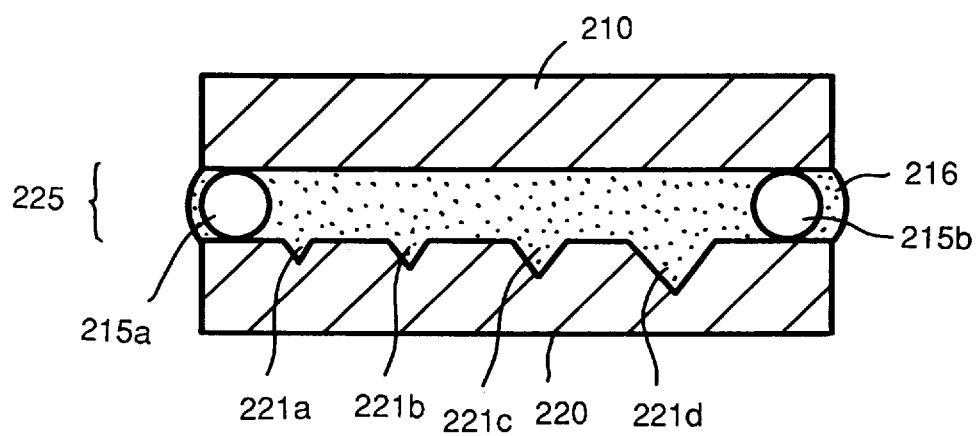
FIG. 17 is a schematic sectional view showing a state that the space between two solid-state components is held by spacers in the apparatus shown in FIG. 16.
Figure 18:
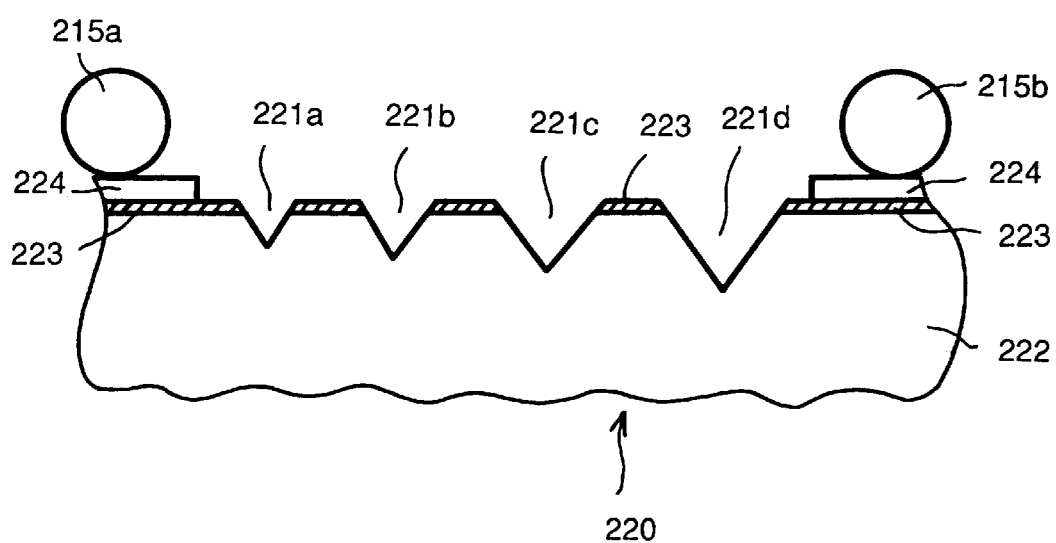
FIG. 18 is a sectional view showing the structure of a principal part of the apparatus as shown in FIG. 17 in detail.

FIGS. 16, 17 and 18 show an example of an apparatus according to the present invention having a plurality of solid-state components. As shown in FIG. 16, two solid-state components 210 and 220 are arranged with a prescribed gap 225 in the apparatus for crystal growth. A plurality of V-shaped grooves (V-grooves) 211a, 211b and 211c whose depths and/or widths of the opening parts differ from each other are formed on the surface of the solid-state component 210. A plurality of V-grooves 221a, 221b, 221c and 221d whose sizes differ from each other are also formed on the surface of the solid-state component 220. The two solid-state components 210 and 220 are so held that the surfaces having the V-grooves are opposed to each other. In this apparatus, the two solid-state components are so arranged that the longitudinal directions of the respective grooves are substantially perpendicular to each other. FIG. 16 omits the spacers for maintaining the gap 225.

FIG. 17 shows such a state that the gap between the solid-state components is maintained by spacers as to the apparatus of FIG. 16.

Spacers 215a and 215b are provided between the solid-state component 210 and the solid-state component 220, and the prescribed gap 225 is maintained. A mother liquor 216 containing molecules for crystallization is injected into the clearance formed by these spacers between the solid-state components. When the clearance between the solid-state components is rendered extremely small with the spacers of a prescribed size, the injected mother liquor is held in the clearance by capillarity. The held mother liquor 216 is in contact with the solid-state component surfaces formed with the V-grooves. The amount of the mother liquor held in this small clearance may be extremely small.

FIG. 18 shows a more detailed structure as to one of the solid-state components. In the solid-state component 220, an N-type silicon layer 223 is formed on a substrate 222 consisting of P-type silicon. The plurality of V-grooves 221a, 221b, 221c and 221d are formed on the surface of the substrate 222. P-type silicon is exposed in the V-groove parts. On the other hand, the surface coming into contact with the solution outside the V-grooves is covered with the N-type silicon layer 223. A water-repellent layer 224 consisting of water-repellent resin, for example, is further provided on the surface of the substrate 222, to surround the V-grooves. When the spacers 215a and 215b are provided through the water-repellent layer, the mother liquor containing the molecules to be crystallized can be further stably held in the clearance. The component having the N-type silicon layer on the P-type silicon as shown in FIG. 18 can be preferably employed for crystallization of a macromolecule dissociating and having negative effective surface charge in a solution. With respect to a macromolecule dissociating and having positive effective surface charge in a solution, on the other hand, a solid-state component with a polarity of silicon reverse to that shown in FIG. 18 can be preferably employed. Namely, a solid-state component having a P-type silicon layer on an N-type silicon substrate and exposing N-type silicon in grooves can be applied for crystallization of the macromolecule having positive effective surface charge.

Figure 19A:
FIGS. 19A, 19B, 19C, 19D, 19E, 19F, 19G are schematic sectional views showing a process for forming the apparatus for crystal growth according to the present invention assembling a plurality of the solid-state components.
Figure 19B:
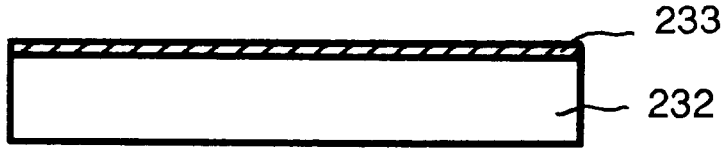
Figure 19C:
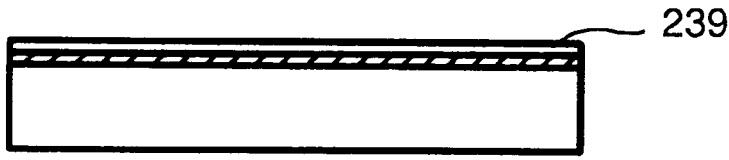
Figure 19D:
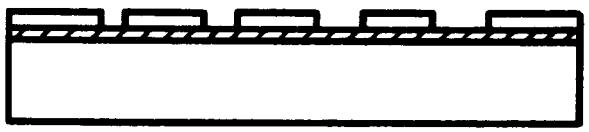
Figure 19E:
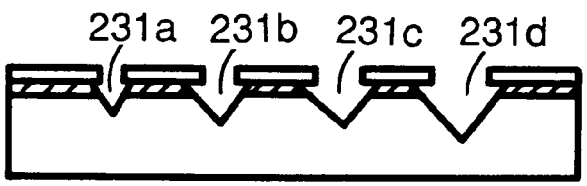
Figure 19F:
Figure 19G:
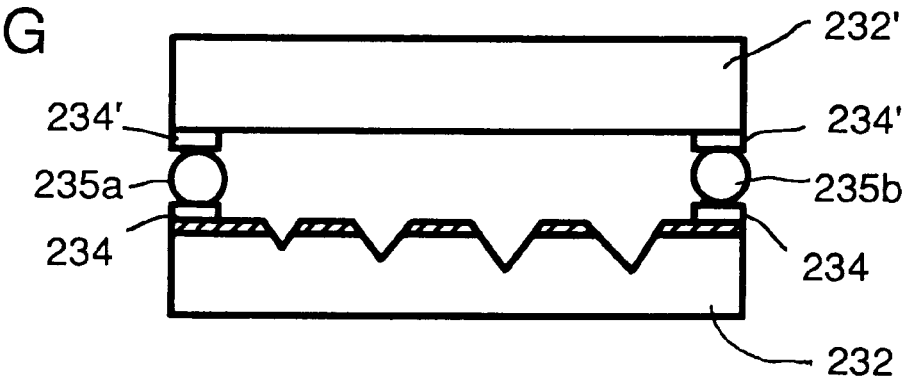

FIG. 19A to FIG. 19G show an outline of a process for forming the solid-state components shown in FIG. 16 to FIG. 18. First, a P-type silicon substrate 232 whose surface is cleaned and mirror-polished, for example, is prepared (FIG. 19A). Then, an N-type silicon layer 233 is formed on the surface of the P-type silicon substrate 232 by ion implantation or the like (FIG. 19B). Thereafter a silicon oxide film ($SiO_2$) 239 is formed by CVD or the like (FIG. 19C). Then, after performing a proper step such as photolithography, parts of the silicon oxide film are removed for forming grooves (FIG. 19D). By etching the parts not covered with the oxide film, grooves 231a, 231b, 231c and 231d are formed (FIG. 19E). Then, after removing the silicon oxide film, a water-repellent resin layer 234 is formed to surround the grooves 231a to d (FIG. 19F). Although not illustrated, a silicon oxide film may be formed on the overall surface of the solid-state component again after the step of removing the silicon oxide film. Substrates 232 and 232' thus formed with N-type silicon layers and grooves are superposed with each other through glass spacers 235a and 235b (FIG. 19G). The spacers 235a and 235b are held between water-repellent resin layers 234 and 234' formed on the substrates. After fixing the two substrates with an adhesive or the like, an apparatus for crystallization is obtained.

The components shown in FIG. 16 have a plurality of V-grooves. In place of the grooves, pyramidal or conical holes, for example, may be provided on the solid-state component surfaces. It is more preferable that the grooves or holes have the widths of the openings narrowed as approaching deeper portions. In practical crystal growth, it is rather advantageous that the surface of a single component has a large number of grooves or holes in several sizes.

Figure 20:
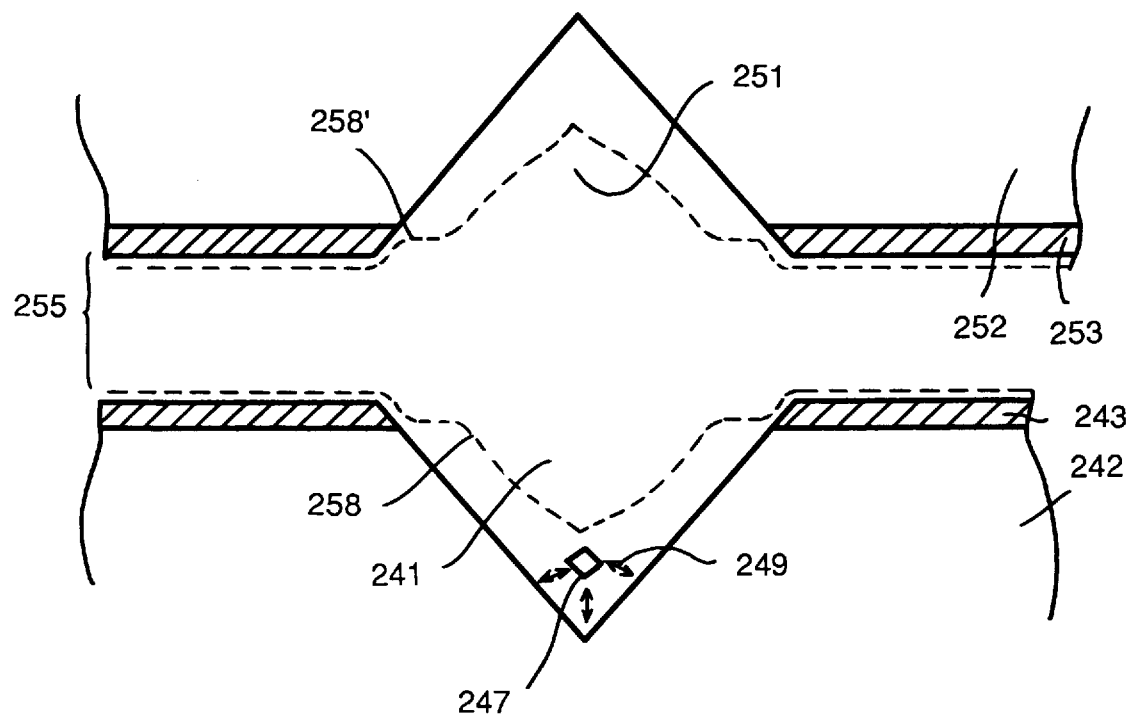
FIG. 20 is a schematic sectional view for illustrating how crystal growth progresses in a groove formed on the solid-state component.
Figure 21:
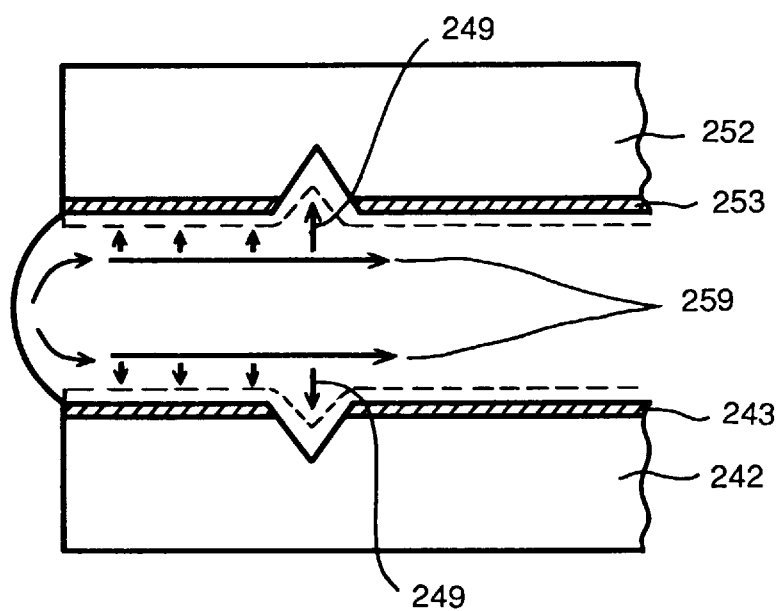
FIG. 21 is a schematic sectional view showing the direction of surface tension and the direction of electrostatic attraction in a solution held between solid-state components.

FIG. 20 to FIG. 22 are adapted to illustrate functions/effects of the grooves or holes on crystal growth. As shown in FIG. 20, when the solid-state components are brought into contact with an electrolytic solution containing molecules to be crystallized, it is expected that in V-groove parts 241 and 251 consisting of P or P$^-$ silicon, the ranges where electrostatic interaction with dissociating macromolecules is exerted (the ranges may be considered as the widths of electric double layers) are wider than those on surface parts 243 and 253 consisting of N or N$^+$ silicon layers. In the figure, regions 258 and 258' shown by dotted lines are the ranges where the electric interaction is exerted. Namely, the regions 258 and 258' are thicker rather in the V-groove parts 241 and 251 than on the surface parts 243 and 253. In particular, it is expected that at the deepest central portions of the V-grooves, the widths of the regions 258 and 258' are widest due to overlap of the regions where the action is exerted.

Therefore, a crystal nucleus or a molecular aggregate 247 to be a crystal nucleus can substantially isotropically receive electrostatic attraction 249 from the V-groove surface at the deepest portion of the V-groove consisting of P or P$^-$ silicon, and can be restrained in the V-groove. Influence of convection in the solution based on the gravity and the electrostatic attraction are canceled out for the molecular aggregate 247 which is present at the deep portion of the V-groove, whereby it is expected that formation of the crystal nucleus and growth of a crystal can stably take place.

As shown in FIG. 21, on the other hand, it is expected that on the surface parts 243 and 253 consisting of N or N+silicon, convection 259 of the solution is caused toward the inner side by surface tension in the gap. In a narrow gap, however, the convection can be suppressed by electrostatic attraction 249 acting in a direction substantially perpendicular to the direction of the surface tension. This electrostatic attraction is brought from the silicon substrates. While the influence of the convection is almost suppressed in the groove where larger electrostatic attraction acts, the molecules to be crystallized receive some influence of the convection outside the groove because only small electrostatic attraction acts outside the groove. Therefore, it is conceivable that low crystallinity or reduction of the growth rate is brought outside the groove because a diffusion supply layer width in the vicinity of the crystal nucleus fluctuates.

As shown in FIG. 22A, when a supply layer 282 of the molecules is homogeneous and isotropic as to a crystal nucleus 280 which is formed in a state having no convection, the crystal homogeneously and isotropically grows and its growth rate is high. As shown in FIG. 22B, on the other hand, when convection takes place in the solution, a supply layer 282' of the molecules is narrowed by the convection as to a crystal nucleus 281. Consequently, the crystal heterogeneously grows and twin crystals are easily generated. The growth rate is also low. In order to suppress the influence of convection caused by gravity or buoyancy, the present invention is adapted to restrain the molecules to be crystallized in the groove by electrostatic attraction acting from the solid-state component surface and to suppress the movement thereof. When the solution is held between two solid-state components, for example, the molecules in the solution can receive electrostatic attraction from the respective components. Namely, the electrostatic attraction comes to act from above and below or from the right and the left. Thus, on the solid-state component surfaces, electrostatic effects upon the molecules are superimposed. Therefore, the molecules are more readily restrained by the electrostatic attraction. When the molecules is influenced by surface tension or gravity in the gap to be moved, the molecules are soon restrained in the groove by the electrostatic effects, so that a crystal grows in the groove.

Since the molecules to be crystallized are restrained in the grooves as described above, it may be preferable that the grooves holding the solution are superposed if possible. On the other hand, crystallization is suppressed on the flat parts with no grooves. Therefore, it is may be more preferable that the grooves are opposed to each other holding the solution between them so that the longitudinal directions of the grooves match with each other. However, the size of the grooves such as width is very small, so that arrangement of the solid-state components for successfully homologizing the positions of the respective grooves is considerably difficult. Therefore, it is more practical that a plurality of the solid-state components are so arranged that the longitudinal directions of the opposed grooves substantially perpendicularly intersect with each other, as shown in FIG. 16.

In this case, the superposition of the opposed grooves can be increased to maximum.

As shown in FIG. 23, further, the distance between a plurality of the solid-state components may vary with the position. In the apparatus shown in FIG. 23, a spacer 295 is inserted into only one end of the clearance between solid-state components 290 and 290'. In this structure, the distance between the components reduces as separating from the spacer 295 on the solid-state components. Namely, the gap continuously reduces as separating from the spacer 295. While this apparatus employs one spacer, two spacers whose sizes differ from each other may also be employed to continuously reduce or increase the gap. In the case of holding two components with a constant space as shown in FIG. 17, it is also conceivable that the prescribed gap may not be optimum depending on the substance to be crystallized. This is because the gap between the components has an effect on the regions where electrostatic attraction is exerted, or on the distributions of surface potentials. Therefore, it is conceivable that conditions optimum for crystallization can be provided on any position when the space between the components is changed in one apparatus as shown in FIG. 23. For example, optimum conditions for a substance A can be provided on a region of X as shown in the figure, while optimum conditions for crystallization can be provided on a region of Y for a substance B which is different from A. Thus, crystallization for various molecules can be performed in one apparatus, and the labor and the cost for the apparatus preparation are also reduced.

Figure 24:
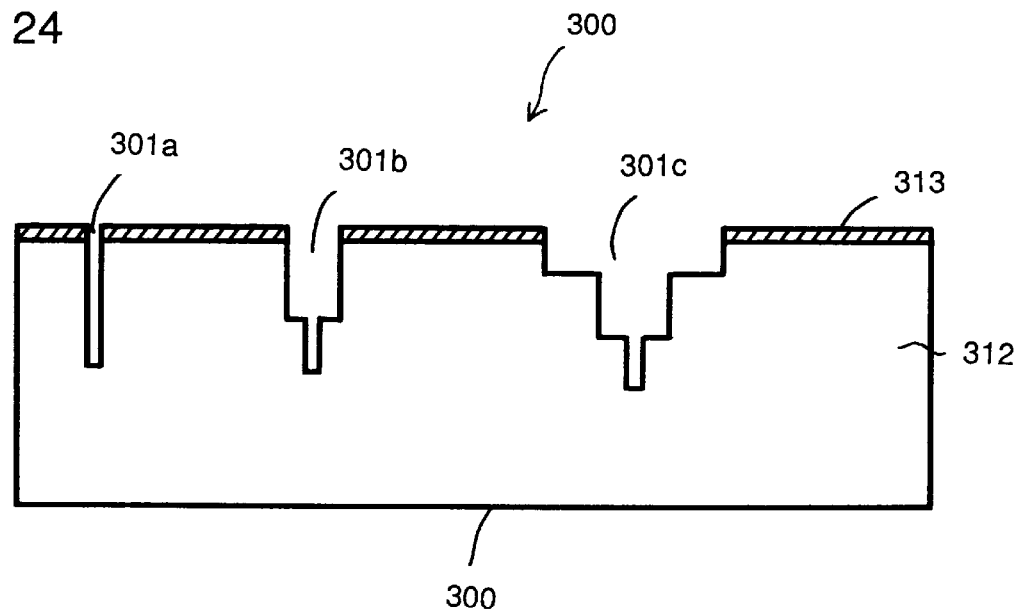
FIG. 24 is a schematic sectional view showing another example of the solid-state component employed for the present invention.

While the solid-state components having V-grooves have been shown in the above, various shapes of the grooves may be employed, and concave grooves such as those shown in FIG. 24 may be formed, for example. In a solid-state component 300, an N-type silicon layer 313 is formed on a P-type silicon substrate 312, and concave grooves 301*a*, 301*b* and 301*c* whose openings differ from each other are provided.

In order to oppose the solid-state components such as silicon substrates to each other with a clearance, a spacer is employed as described above. While the material for the spacer is not particularly limited, glass may be preferably employed, for example. A columnar one or a prismatic one may be employed as the spacer, for example. The distance between the components is preferably in the range of 0.1 to 10 mm, for example. In the case of employing a columnar spacer, therefore, the diameter of the spacer may be set in the range of 0.1 to 10 mm. A plurality of the solid-state components holding the spacer may be fixed by adhesion or welding, for example.

As shown in FIG. 18, it is preferable that a water-repellent layer is formed on the solid-state component surface of a silicon substrate or the like, to surround the grooves. This layer can effectively prevent a solution from flowing out to the periphery when the solution is held between the components. While a silicon surface obtained by removing the oxide film, for example, is generally water-repellent with respect to pure water or water containing only acid or alkali, the same is not water-repellent with respect to an aqueous solution containing salt such as a buffer solution. When a buffer solution is employed, therefore, a layer consisting of a water-repellent substance should be formed around the silicon substrate. The water-repellent layer may be composed of organic resin, for example, and polyimide resin is one of the materials which can most conveniently form the water-repellent layer. When a water-repellent layer consisting of polyimide is prepared, the substrate is coated with photosensitive or non-photosensitive polyimide resin and the resin is hardened, and then unnecessary parts may be removed by etching or development to obtain a desired pattern.

While the thickness of the water-repellent layer employed in the present invention may not be functionally limited in particular, that of a thickness in the range of 0.1 to 100 $\mu$m is relatively easy to prepare. Various materials may also be employed for this layer so far as the same exhibit water repellence and are chemically stable in the solution. When the employed solution exhibits water repellence with respect to the solid-state component of silicon or the like, such a water-repellent layer is unnecessary.

Figure 25:
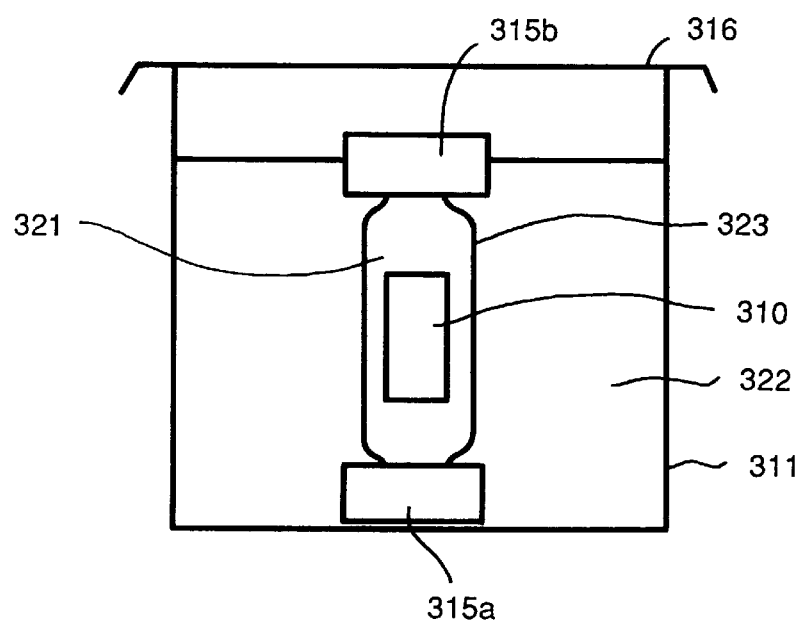
FIG. 25 is a schematic diagram showing another example of the apparatus for performing the crystal growth method according to the present invention.

FIG. 25 shows a more specific apparatus for carrying out the present invention. In the apparatus shown in FIG. 25, a buffer solution 322 is stored in a container 311, and a dialysis membrane tube 323 is provided therein. The dialysis membrane tube 323 houses a mother liquor 321 containing a macromolecule and an apparatus 310 for crystal growth in which the solid-state components for crystallization control, e.g., the two silicon semiconductor substrates such as those described above, are opposed to each other with a prescribed space. The dialysis membrane tube 323 is sealed with closers 315a and 315b, and dipped in the buffer solution 322. The opening of the container 311 is covered with a lid 316. In this apparatus, dialysis is progressed and a crystal of macromolecules is deposited on the crystal growth apparatus 310 from the mother liquor 321. Besides this apparatus, other methods and apparatus with no dialytic tube may also be applied, in which a mother liquor is held on a silicon substrate in the form of a droplet for performing crystallization, for example,.

Figure 26:
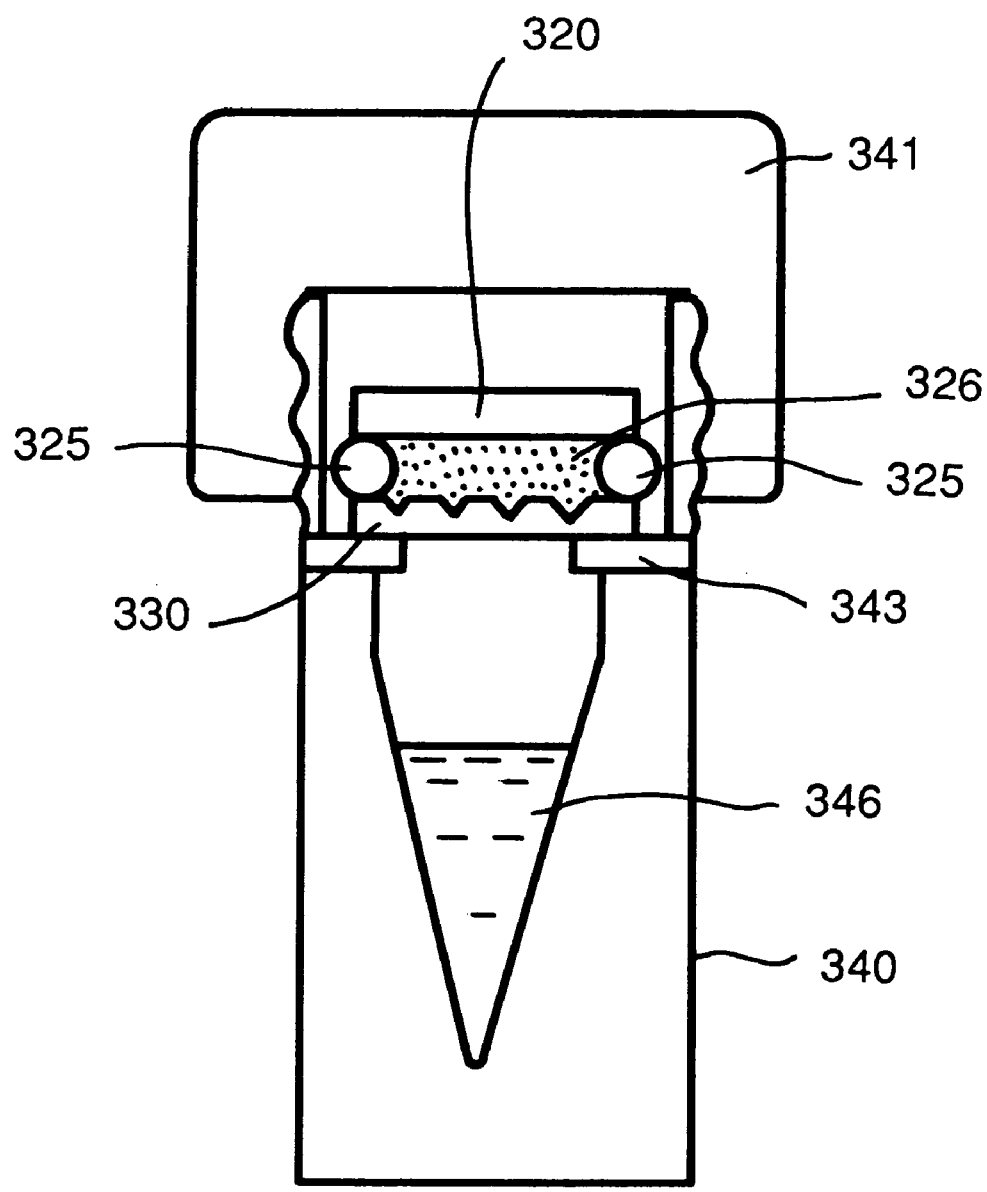
FIG. 26 is a schematic sectional view showing a further example of the apparatus for crystal growth according to the present invention.

FIG. 26 shows an example of the apparatus enabling crystal growth with an extremely small amount of mother liquor. In this apparatus, the unit, in which an upper substrate 320 and a lower substrate 330 as the solid-state components are superposed with each other through a spacer 325, is held by a mounting 343 at an upper region in a container 340. Between the substrate 320 and the substrate 330, a small amount of a solution (mother liquor) 326 containing a substance to be crystallized such as protein is injected with a pipette or the like from the side thereof. When the mother liquor is stably held with no droplet of the mother liquor dripping from the clearance between the substrates, injection of the mother liquor is stopped. The bottom portion of the container 340 is previously filled with a buffer solution 346. The buffer solution 346 is employed for holding gas-liquid equilibrium with respect to the mother liquor 326. The container 340 in which the substrates holding the mother liquor 326 are stored with the buffer solution 346 may be sealed with a cap 341. The mother liquor 326 is held between the substrates and allowed to stand in the sealed state, so that a crystal grows in any groove formed in the substrates. In the apparatus shown in FIG. 26, a desiccant for absorbing a solvent (e.g., moisture) from the mother liquor may be employed in place of the buffer solution.

The present invention may be employed for crystallizing various macromolecules, particularly macromolecular electrolytes. The present invention is preferably applied for crystallizing proteins such as enzymes and membrane proteins, polypeptides, peptides, polysaccharides, nucleic acids, and complexes and derivatives thereof. The present invention is preferably applied for crystallization of biological macromolecules.

DESCRIPTION OF THE PREFERRED EMBODIMENTS

EXAMPLE 1

Lysozyme from chicken egg white was dissolved in a standard buffer solution of pH 6.8 in a concentration of 20 mg/ml. Then 5 ml of the solution and a silicon crystal was enclosed with a sufficiently boiled and washed dialytic tube. Two types of silicon crystals described below were employed, and crystallization of lysozyme was carried out in the apparatus as shown in FIG. 8.

(1) Sample-1

The sample was prepared by entirely forming an N-type silicon layer of low resistance on a P-type silicon substrate surface of about 20 $\Omega$cm in specific resistance by ion implantation of phosphorus. The specific resistance of the formed N-type silicon layer was about 0.1 $\Omega$cm, and its thickness was about 0.5 $\mu$m. This silicon substrate was cut into the size of 5 mm by 10 mm, and employed for crystallization.

(2) Sample-2

A silicon substrate having an N-type silicon layer formed by a similar process to the sample-1 was employed and worked by the process as shown in FIG. 4A to FIG. 4F to have V-grooves. Five types of V-grooves having widths of 0.8, 2.0, 10, 50 and 100 $\mu$m respectively, lengths of 5 mm and depths identical to the respective widths were formed on the silicon substrate at a pitch of 0.5 mm. The silicon substrate having the V-grooves was cut into the size of 5 mm by 10 mm, and employed as the solid-state component for crystallization. In this solid-state component, the P-type silicon is exposed in the formed V-grooves, as described above.

The above silicon crystals of (1) and (2) were stored in the dialytic tube containing lysozyme, and the dialytic tube was dipped in an aqueous solution prepared by mixing 200 ml of a standard buffer solution of pH 4.5 and 20 ml of 1 M NaCl in the apparatus as shown in FIG. 8, and kept in a cool dark place at 10° C. After keeping the tube in the cool dark place for 96 hours, the samples were taken out and crystals of lysozyme formed on the silicon crystals were observed with a microscope.

Figure 27:
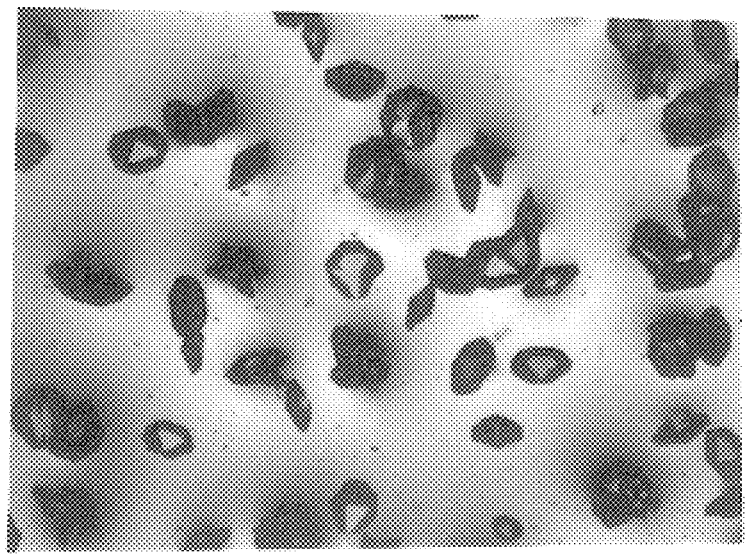
FIG. 27, FIG. 28 and FIG. 29 are photomicrographs of crystal structures formed in Example 1.

On the sample-1, microcrystals or twins of lysozyme were disorderly deposited in a large amount on the overall surface of the silicon substrate, as shown in FIG. 27. The average size of the deposited crystals was 0.05 mm.

Figure 28:
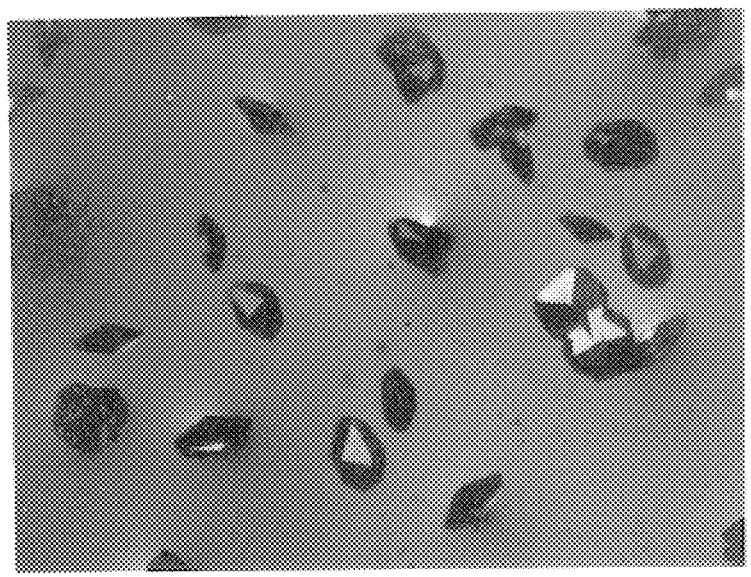
Figure 29:
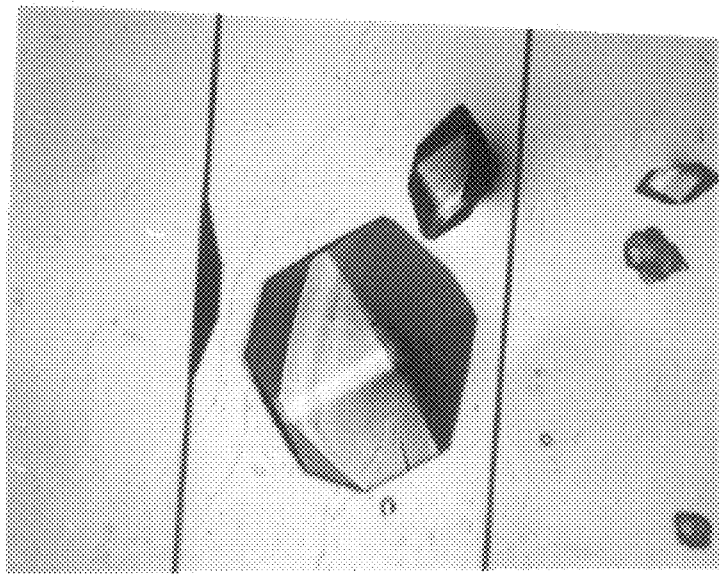

On the sample-2, on the other hand, the sizes of the deposited crystals varied with the sizes of the grooves. In the V-grooves of the sizes of 0.8 and 2.0 μm in width, crystals were disorderly deposited in the same form as on the sample-1, as shown in FIG. 28. In the V-grooves of the sizes of 10, 50 and 100 μm in width, on the other hand, large-sized single crystals of about 0.3 mm in size were regularly deposited along the grooves, as shown in FIG. 29. It is conceivable that the formation of the crystals may be suppressed on the N-type silicon layer while deposits to be nuclei of the crystals may be selectively aggregated and gathered in the V-grooves consisting of the P-type silicon and these may grow to the large-sized crystals in the V-grooves.

While the components having the N-type silicon layers on the P-type silicon were employed in the aforementioned Example, it is expected that similar results are also obtained when an N-type layer of low resistance is formed on an N-type substrate of high resistance and grooves are formed for exposing the high-resistance N-type substrate. Namely, it is expectable that deposits to be nuclei of crystals are selectively aggregated and gathered on the high-resistance N-type regions exposed in the grooves and grow to large-sized crystals.

EXAMPLE 2

Lysozyme from chicken egg white was dissolved in a standard buffer solution of pH 6.8 in a concentration of 50 mg/ml. Two types of silicon crystals described below were employed as the solid-state component, and crystallization of lysozyme was carried out in the apparatus as shown in FIG. 14 and FIG. 15.

(1) Sample-1

An N-type silicon layer of low resistance was entirely formed on the surface of a P-type silicon substrate of about 20 Ωcm in specific resistance by ion implantation of phosphorus. Thereafter working was carried out based on the process as shown in FIG. 12A to FIG. 12H to form a silicon substrate having a plurality of V-grooves. The widths of the V-grooves having different sizes were 0.8, 2.0, 10, 50 and 100 μm respectively, and the depths were substantially identical to the widths of the respective grooves. The lengths of all grooves were 7 mm, and the five types of V-grooves were formed at a pitch of 1.0 mm. A through hole of about 200 μm in diameter was also formed at the central portion of the substrate. The thickness of a polyimide layer formed to surround the five types of grooves was 10 μm. The obtained silicon substrate was cut into the size of 10 mm by 10 mm, and used as the solid-state component for crystallization. The specific resistance of the N-type silicon layer formed on the surface was about 0.1 Ωcm, and the thickness was about 0.5 82 m.

(2) Sample-2

Ion implantation was carried out in a similar manner as the sample-1, for forming an N-type silicon layer on a P-type silicon substrate. Specific resistance and the thickness of the N-type layer are identical to those of the sample-1. Thereafter a through hole of about 200 μm in diameter was formed at the central portion of the substrate and a polyimide layer was formed, under the same conditions as those for the sample-1. The obtained silicon substrate was cut into the size of 10 mm by 10 mm, and used as the solid-state component for crystallization. Therefore, the sample-2 had the same structure as the sample-1, except that it had no V-grooves.

The substrates of the sample-1 and the sample-2 were set in the apparatus as shown in FIG. 14 and FIG. 15 respectively. In the apparatus, the silicon substrates were held at an upper region in a reactive vial of about 15 mm in diameter, and each surface formed with the N-type silicon layer was arranged downward. About 0.1 ml of the mother liquor of lysozyme was injected into each through hole from each rear side, for forming a droplet hanging down in the direction of gravity. About 3 ml of a buffer solution prepared by mixing a standard buffer solution of pH 4.6 and 1 M NaCl in a volume ratio of 10:1 was previously injected into the vial, and held on the bottom thereof. The apparatus for crystallization was kept in a cool dark place at 10° C., and allowed to stand.

After the apparatus was allowed to stand in the cool dark place for 96 hours, each sample was taken out for observing crystals of lysozyme formed on each silicon substrate with a microscope.

Figure 30:
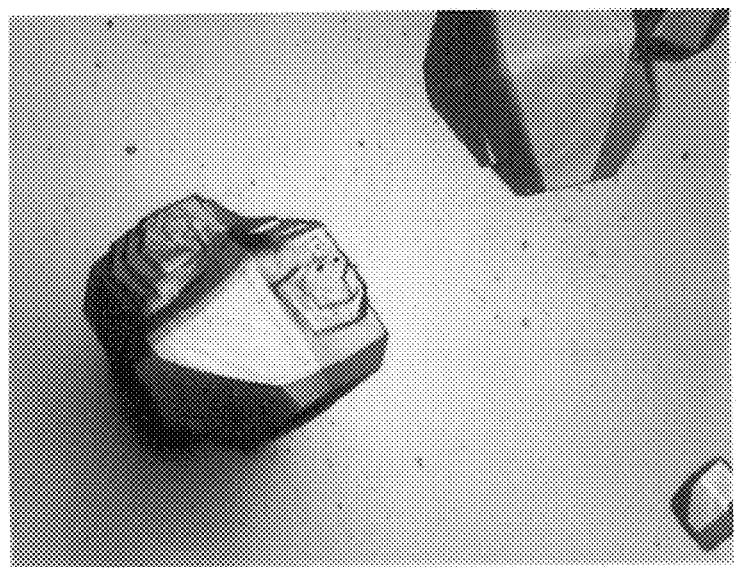
FIG. 30, FIG. 31 and FIG. 32 are photomicrographs of crystal structures formed in Example 2.
Figure 31:
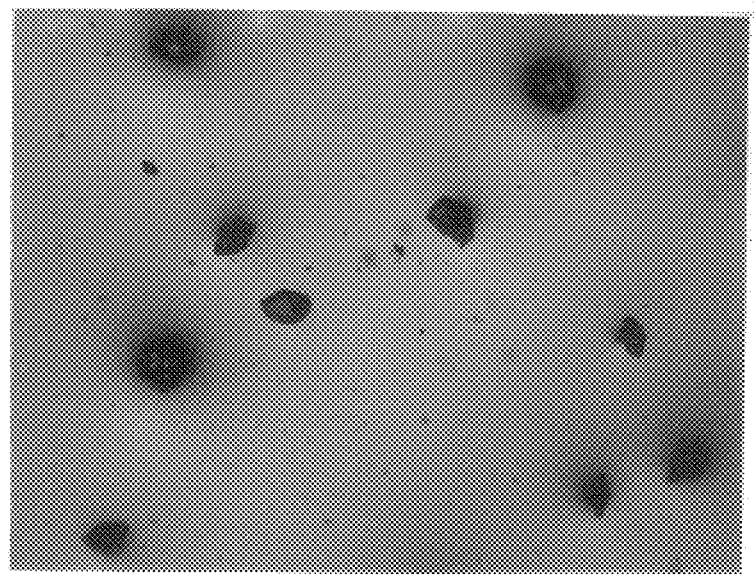

On the substrate of the sample-1, the sizes of the deposited crystals varied with the sizes of the grooves. In the V-grooves of the sizes of 0.8 and 2.0 μm in width and on the N-type silicon layer surface, microcrystals and twins were disorderly deposited as shown in FIG. 31. In the V-grooves of the sizes of 10, 50 and 100 μm in width, on the other hand, large-sized single crystals whose sizes were about 0.3 mm as shown in FIG. 30 were regularly deposited along the grooves. This is conceivably because deposits to be nuclei of crystals are selectively aggregated and gathered in the specific V-grooves consisting of the P-type silicon and these grow to large single crystals.

Figure 32:
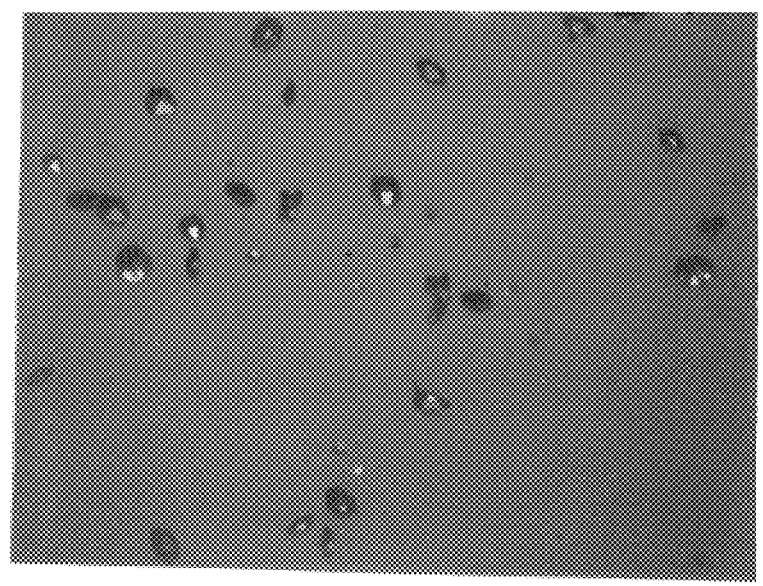

On the substrate of the sample-2, on the other hand, microcrystals or twins of lysozyme were disorderly deposited in a large amount on the overall surface of the silicon substrate, as shown in FIG. 32. The average size of the deposited crystals was 0.05 mm.

From the above results, it has been demonstrated that a large-sized single crystal of good quality can be obtained from a very small amount of sample according to the present invention.

While the components having the N-type silicon layer on the P-type silicon were employed in the aforementioned Example, it is expected that similar results are also obtained when an N-type layer of low resistance is formed on an N-type substrate of high resistance and grooves are similarly formed for exposing the high-resistance N-type substrate. Namely, it is expectable that deposits to be nuclei of crystals are selectively aggregated and gathered on the high-resistance N-type regions exposed in the grooves, to grow to large crystals.

EXAMPLE 3

Lysozyme from chicken egg white was dissolved in a solution prepared by mixing a standard buffer solution of pH 4.5 and 0.1 M NaCl in the volume ratio of 10:1, in a concentration of 50 mg/ml. Two types of silicon crystals described below were employed as the solid-state components for crystallization.

(1) Sample-1

An N-type silicon layer of low resistance was entirely formed on the surface of a P-type silicon substrate of about 20 Ωcm in specific resistance by ion implantation of phosphorus. Thereafter six types of V-grooves having different sizes were formed according to the process as shown in FIG. 19A to FIG. 19G. The widths of the V-grooves were 0.1, 0.5, 2.0, 10, 50 and 100 μm respectively. The depths of the respective V-grooves were substantially identical to the respective widths. The lengths of all grooves were 10 mm, and the six types of V-grooves were formed at a pitch of 1.0 mm. A polyimide layer of 10 μm in thickness was also formed to surround the six types of V-grooves. The obtained silicon substrate was cut into the size of 15 mm by 15 mm, and employed as the solid-state component. The specific resistance of the N-type silicon layer formed on the surface was about 0.2 Ωcm, and the thickness thereof was about 0.7 Ωm.

(2) Sample-2

Ion implantation was carried out in a similar manner as the sample-1, for forming an N-type silicon layer on a P-type silicon substrate. Specific resistance and the thickness of the N-type layer are identical to those of the sample-1. On the other hand, no V-grooves were formed on the substrate.

Two pieces of the silicon crystals of the sample-1 having the grooves were prepared and superposed with glass rods of 2 mm in diameter and about 5 mm in length inserted between the silicon crystals. The glass rods were arranged on the polyimide layers formed on the respective silicon substrates. The two pieces of the silicon substrates were so arranged that the longitudinal directions of the opposed grooves intersected perpendicularly to each other.

The unit obtained by superposing the silicon substrates with the glass rods inserted between the silicon substrates was stored in a container as shown in FIG. 26. A reactive vial of about 20 mm in diameter was employed as the container. At an upper region in the vial, the unit was held on a mounting so that the substrate surfaces were horizontal, and about 0.5 ml of the above mother liquor of lysozyme was injected between the substrates. Into the bottom portion of the vial, about 10 ml of a standard buffer solution of pH 4.5 was previously injected. The vial was sealed with a cap, and kept in a cool dark place at 10° C.

Two silicon substrates of the sample-2 were opposed to each other under the same conditions as those for the sample-1, for preparing an apparatus for crystallization. The substrates superposed with each other through glass rods were held at an upper region in a reactive vial similarly to the sample-1, and about 0.5 ml of the above mother liquor of lysozyme was injected between the substrates. A standard buffer solution of pH 4.5 was previously injected into the bottom portion of the vial. The vial was sealed with a cap, and thereafter kept in a cool dark place at 10° C.

Figure 33:
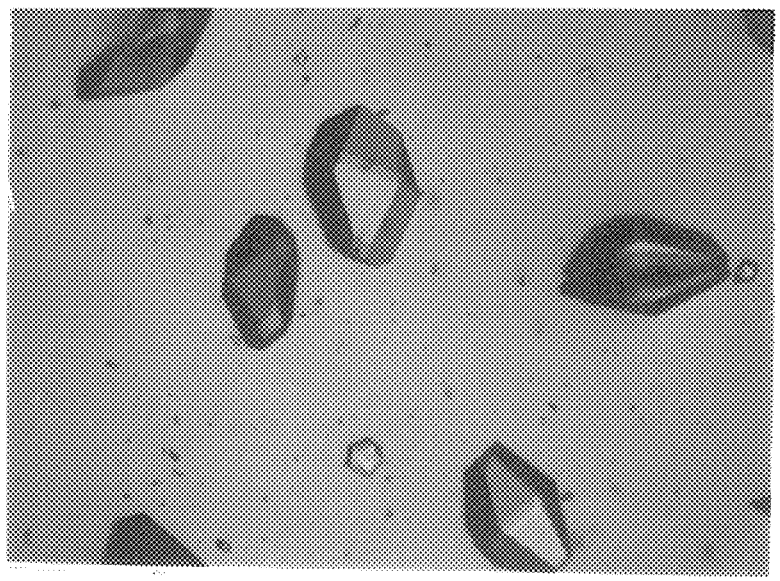
FIG. 33, FIG. 34 and FIG. 35 are photomicrographs of crystal structures formed in Example 3.
Figure 34:
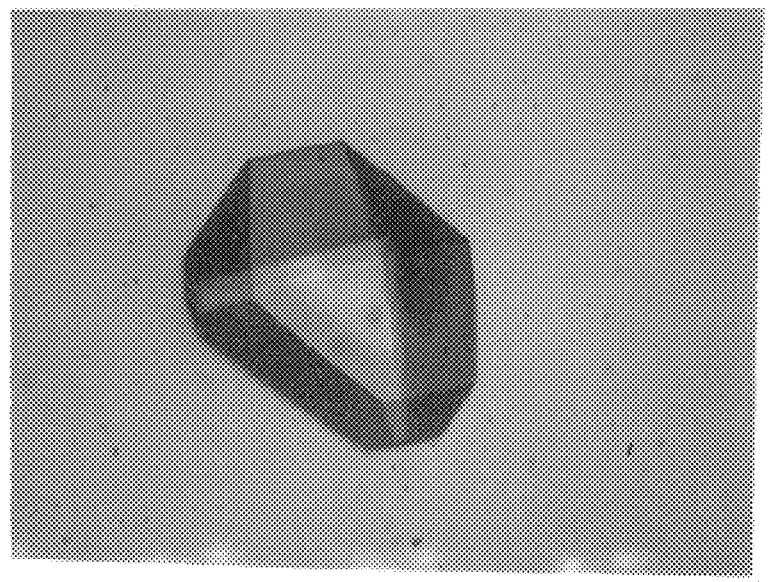

After keeping the respective samples in the cool dark place for 72 hours, the superposed silicon substrates were carefully opened for observing crystals of lysozyme formed on the surfaces thereof with a microscope. On the substrates of the sample-1, sizes of the deposited crystals varied with the sizes of the grooves. In the V-grooves whose widths were 0.1, 0.5 and 2.0 μm and on the surfaces of the N-type silicon layers, microcrystals and twins were disorderly deposited as shown in FIG. 33. In the V-grooves whose widths were 10, 50 and 100 μm, on the other hand, large-sized single crystals of about 0.3 mm size as shown in FIG. 34 were regularly deposited along the grooves.

Figure 35:
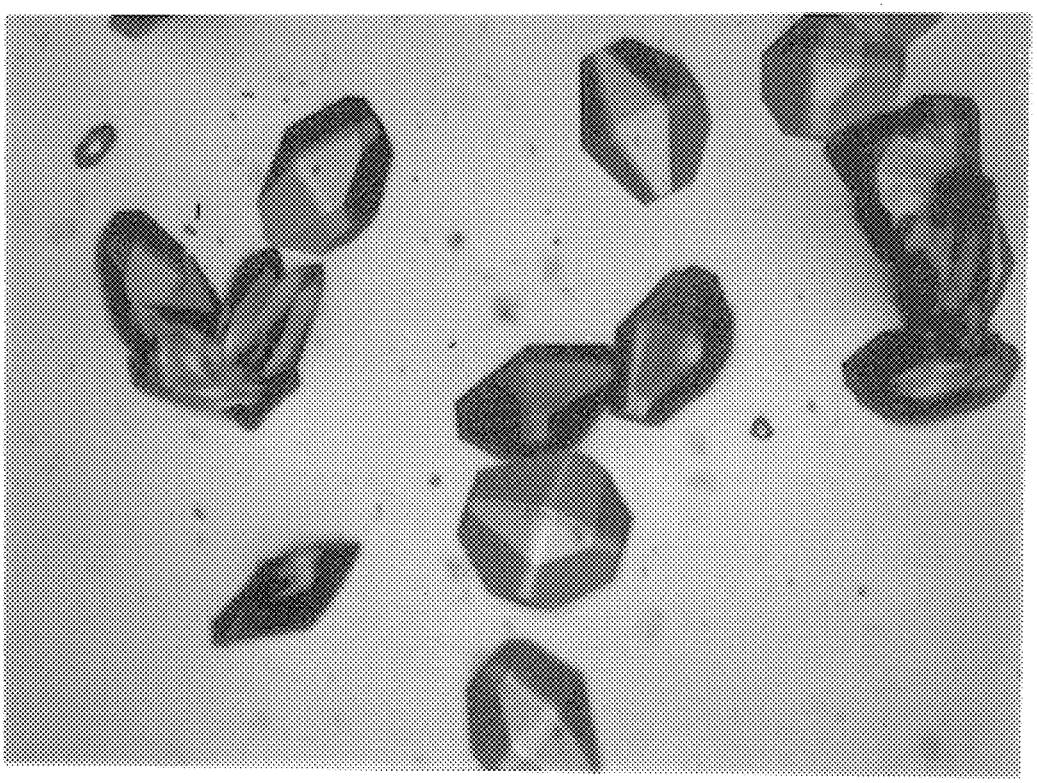
Figure 36:
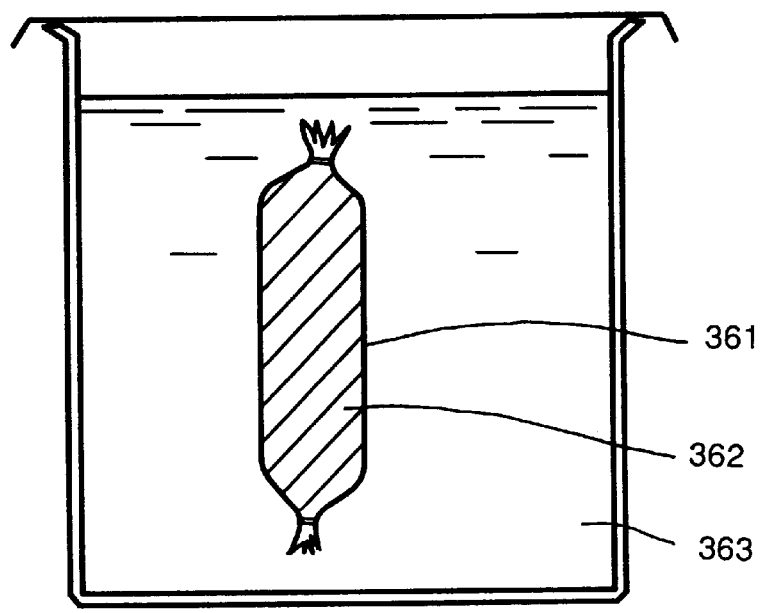
FIG. 36 is a schematic diagram showing one example of the apparatus employed for a conventional method.
Figure 37:
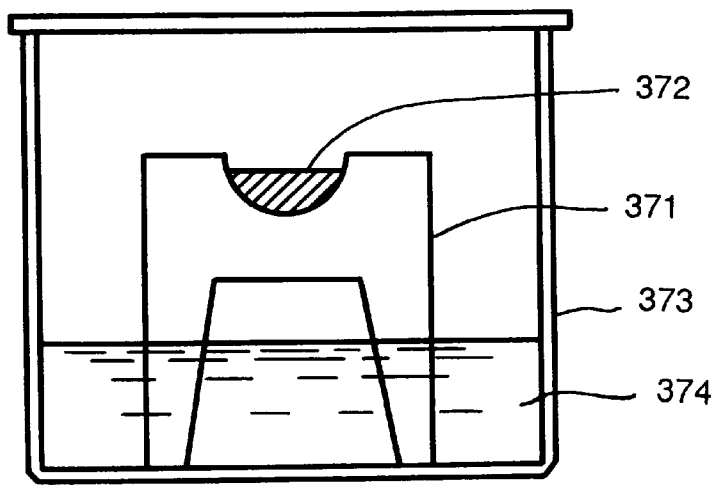
FIG. 37 is a schematic diagram showing another example of the apparatus employed for a conventional method.

On the substrates of the sample-2, microcrystals or twins of lysozyme were disorderly deposited in a large amount on the overall surfaces of the silicon substrates, as shown in FIG. 35. The average size of the deposited crystals was about 0.05 mm.

Thus, it has been demonstrated that according to the present invention, a large-sized single crystal of good quality can be prepared from a very small amount of sample by employing the apparatus as shown in FIG. 26.

While the components having the N-type silicon layer on the P-type silicon were employed in the above example, it is expected that similar results are also obtained when an N-type layer of low resistance is formed on an N-type substrate of high resistance and grooves are similarly formed for exposing the high-resistance N-type substrate. Namely, it is expectable that deposits to be nuclei of crystals are selectively aggregated and gathered on the high-resistance N-type regions exposed in the grooves, to grow to large crystals.

According to the present invention, as described above, it is possible to overcome the disadvantages of the conventional crystallization process which has been carried out with repeating trial and error and with no technique applicable to any substance of various properties. Particularly according to the present invention, the influence of convection in a solvent resulting from gravity can be suppressed, and stable nucleation can be made in the initial process of crystallization. According to the present invention, it is also possible to suppress or control mass production of microcrystals, and to obtain a large-sized crystal which can enable X-ray structural analysis. According to the present invention, crystallization for all types of macromolecules can be arranged by employing the solid-state component provided with a plurality of grooves whose sizes differ from each other. The labor for individually preparing the substrates depending on the types of macromolecules to be crystallized can be saved, and crystallization is enabled at a low cost. According to the present invention, effective crystallization can be performed in a very small amount of sample by supplying a droplet of a solution containing molecules to be crystallized onto the solid-state component via a through hole and holding the droplet to hang down in the direction of gravity. In addition, crystallization can be made in an extremely small amount of sample by superposing a plurality of the solid-state components with each other and making the clearance therebetween hold a solution containing molecules to be crystallized.

The present invention is applied to research, development and production of useful substances, particularly biological macromolecules such as proteins, nucleic acids and the like, in pharmaceutical industry, food industry and the like. According to the present invention, it is possible to grow a crystal having good crystallinity enabling X-ray structural analysis. Information obtained as to the molecular structure and the mechanism of activity as a result of crystal analysis is applied to design and preparation of medicines. The present invention is also applied to purification or crystallization of molecules of interest. In addition, the application of the present invention is expected for the preparation of an electronic device employing biological macromolecules such as proteins. The apparatus of the present invention can selectively adsorb and fix biological macromolecules or the like, and therefore can be applied to biosensors and measuring devices with the biosensors using various biological tissues and biological substances.

The embodiments disclosed this time must be considered as illustrative and not restrictive in all points. The scope of the present invention is shown not by the above description but by claims, and it is intended that all changes in the meaning and range equal to claims are included.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of growing a crystal of a macromolecule contained in a solution, comprising:
   a step of providing a solid-state component, whose valence electrons are controlled so that the concentration of holes or electrons in the surface part can be controlled in response to the environment of a solution containing said macromolecule, and which has at least two grooves or holes whose depths and/or widths of the opening parts differ from each other; and
   a step of bringing said solid-state component into contact with the solution containing said macromolecule to cover said at least two grooves or holes with said solution, wherein
   said valence electrons in said solid-state component are differently controlled between the inside and the outside of each of said grooves or holes so that crystallization of said macromolecule is facilitated inside rather than outside said grooves or holes, and
   a crystal of said macromolecule is grown in at least one of said grooves or holes holding said solution under an electrical state brought to the surface of said solid-state component by said controlled valence electrons.

2. The method in accordance with claim 1, wherein said solid-state component is an impurity doped semiconductor substrate, and the type and/or the concentration of the impurity in said semiconductor substrate is different between the inside portion and the outside portion of said grooves or holes.

3. The method in accordance with claim 1, wherein the macromolecule comprises at least one protein.

4. The method in accordance with claim 1, wherein the solution comprises an eletrolytic solution and the macromolecule has a negative charge in the solution.

5. The method in accordance with claim 1, wherein the grooves and/or holes hive a width of 0.01 to 100 $\mu$m.

6. The method in accordance with claim 1, wherein electrostatic attraction of the macromolecule to surfaces of the grooves and/or holes counteracts gravitational forces on the macromolecule and minimizes convection in the solution surrounding the macromolecule.

7. A method of growing a crystal of a macromolecule contained in a solution, comprising:
   a step of providing a solid-state component whose valence electrons are controlled so that the concentration of holes or electrons in the surface part can be controlled in response to the environment of a solution containing said macromolecule; and
   a step of bringing said solid-state component into contact with the solution containing said macromolecule, wherein said solid-state component has at least two grooves or holes, whose depths and/or widths of the opening parts differ from each other, and which are formed on one surface side of the opposed two principal surfaces, and said solid-state component also has a through hole for supplying the solution containing said macromolecule into said grooves or holes from the other surface side of said two principal surfaces, and
   said valence electrons in a part of said solid-state component coming into contact with said solution are so controlled that crystallization of said macromolecule is facilitated inside rather than outside said grooves or holes,
   said solution containing said macromolecule is supplied into downwardly directed said grooves or holes via said through hole so that said grooves or holes hold said solution in such a state that a dioplet of said solution hangs down in the direction of gravity on said solid-state component, and
   a crystal of said macromolecule is allowed to be grown in said grooves or holes holding said solution under an electrical state brought to the surface of said solid-state component by said controlled valence electrons.

8. The method in accordance with claim 7, wherein said solid-state component is an impurity doped semiconductor substrate, and the type and/or the concentration of said impurity in said semiconductor substrate is different between the inside portion and the outside portion of said grooves or holes.

9. The method in accordance with claim 7, wherein a water-repellent layer is provided on said solid-state component, to surround said at least two grooves or holes.

10. The method in accordance with claim 7, wherein growth of the crystal in said grooves or holes holding said solution is carried out in the presence of a precipitant absorbing vapor of a solvent contained in said solution or in the presence of a buffer solution for holding gas-liquid equilibrium as to said solution.

11. A method of growing a crystal of a macromolecule contained in a solution, comprising:
   a step of providing a plurality of solid-state components, whose valence electrons are controlled so that the concentrations of holes or electrons in the surface parts can be controlled in response to the environment of a solution containing said macromolecule, and which have at least two grooves or holes whose depths and/or widths of the opening parts differ from each other;
   a step of opposing the surfaces with said grooves or holes of said plurality of solid-state components to each other and holding said plurality of solid-state components with a prescribed clearance therebetween; and
   a step of making said clearance hold the solution containing said macromolecule and bringing said solution into contact with the surfaces with said grooves or holes of said plurality of solid-state components, wherein
   said valence electrons in said solid-state components are so controlled that crystallization of said macromolecule is facilitated inside rather than outside said grooves or holes, and
   a crystal of said macromolecule is allowed to be grown in said grooves or holes holding said solution under an electrical state brought to the surfaces of said solid-state components by said controlled valence electrons.

12. The method in accordance with claim 11, wherein said solid-state components are impurity doped semiconductor substrates, and the type and/or the concentration of said impurity in said semiconductor substrates is different between the inside portion and the outside portion of said grooves or holes.

13. The method in accordance with claim 11, wherein said solid-state components are so held that the distance between said opposed said plurality of solid-state components continuously reduces or increases.

14. A method of growing a crystal of a macromolecule contained in a solution, comprising:
   providing a solid-state component, which has at least two grooves or holes whose depths and/or widths of the opening parts differ from each other, and in which the concentration of holes or electrons present at a surface thereof has been differently modified between the inside and the outside of each said grooves or holes so that said inside and said outside are different in an electrical state to be brought to the surface of said solid-state component in said solution;

contacting said solid-state component with said solution containing said macromolecule to cover said at least two grooves or holes with said solution; and keeping the contact of said solid-state component with said solution to grow a crystal of said macromolecule on the surface of said solid-state component.

15. The method of claim 14, wherein the modified concentration of the holes or electrons is generated by doping an impurity into the solid-state component and the type and/or the concentration of the impurity in the solid-state component is different between the inside and the outside of each said grooves or holes.

16. The method of claim 14, wherein said solid-state component is a semiconductor substrate.

17. The method of claim 16, wherein said semiconductor substrate is a silicon substrate, and said inside comprises P-type silicon and said outside comprises N-type silicon or said inside comprises N-type silicon and said outside comprises P-type silicon.

18. The method of claim 14, wherein the concentration of holes or electrons has been differently modified between said inside and said outside so that the crystallization of said macromolecules is facilitated inside rather than outside said grooves or holes.

* * * * *